United States Patent
Ura

(10) Patent No.: US 10,956,180 B2
(45) Date of Patent: Mar. 23, 2021

(54) METHOD OF CREATING PROGRAM FOR MEASUREMENT SYSTEM, MEASUREMENT SYSTEM THEREFOR, AND COMPUTER READABLE RECORDING MEDIUM THEREFOR

(71) Applicant: Keysight Technologies, Inc., Santa Rosa, CA (US)

(72) Inventor: Tomonori Ura, Chofu (JP)

(73) Assignee: Keysight Technologies, Inc., Santa Rosa, CA (US)

( * ) Notice: Subject to any disclaimer, the term of this patent is extended or adjusted under 35 U.S.C. 154(b) by 394 days.

(21) Appl. No.: 16/027,919

(22) Filed: Jul. 5, 2018

(65) Prior Publication Data

US 2019/0012189 A1  Jan. 10, 2019

(30) Foreign Application Priority Data

Jul. 5, 2017  (JP) ................................ 2017-131935

(51) Int. Cl.
    *G06F 9/451*     (2018.01)
    *G01R 31/319*     (2006.01)
    *G06F 8/30*     (2018.01)

(52) U.S. Cl.
CPC ....... *G06F 9/451* (2018.02); *G01R 31/31907* (2013.01); *G01R 31/31912* (2013.01); *G06F 8/30* (2013.01)

(58) Field of Classification Search
CPC ........ G01R 31/31912; G01R 31/31907; G06F 9/451; G06F 8/30; G06F 8/34
See application file for complete search history.

(56) References Cited

U.S. PATENT DOCUMENTS

2008/0243732 A1   10/2008   Cataldo et al.
2011/0057663 A1    3/2011   Iwamoto et al.
2016/0291944 A1* 10/2016   Jefferson ............. G06F 3/04847
(Continued)

OTHER PUBLICATIONS

William Sitch, "Agilent Technologies IVI-COM driver and VISA-COM I/O programming examples in Microsoft Visual C#", Agilent Technologies, Apr. 2010, pp. 1-25.
(Continued)

*Primary Examiner* — Brian W Wathen

(57) ABSTRACT

Provided are a measurement system that has a plurality of measurement modules and is capable of creating a program of each measurement module easily and a method of creating a program therefor. A measurement system 100 includes a first and second measurement modules 120 and 130, and a controller 102 controlling thereof, in which the controller includes a first processor, a first memory and a first timer; the first measurement module includes a second processor, a second memory, and a second timer; and the second measurement module includes a third processor, a third memory, a third timer; the controller further includes a first function column including one or more execution steps of a first function sequence to be executed by the first measurement module, and a second function column including one or more execution steps of a second function sequence to be executed by the second measurement module, the second function column being adjacent in a first adjacent direction of the first function column.

20 Claims, 31 Drawing Sheets

(56) References Cited

U.S. PATENT DOCUMENTS

2016/0349312 A1* 12/2016 Helfman .............. G01R 35/005
2018/0253194 A1*  9/2018 Javadi ................... G06F 3/0484

OTHER PUBLICATIONS

"Getting started with LabVIEW", National Instruments, Jun. 2013, pp. 1-89.
"VEE Pro 9.32 Data Sheet", Keysight Technologies, Aug. 3, 2014, pp. 1-8.
"BenchVue Software v3.7 (BV0000A)", Keysight Technologies, Nov. 3, 2016, pp. 1-15.
"PXI Digital Pattern Instruments Bring Semiconductor ATEClass Digital to the Open PXI Platform", National Instruments, Feb. 14, 2017, http://www.ni.com/whitepaper/53237/en/, pp. 1-11.

* cited by examiner

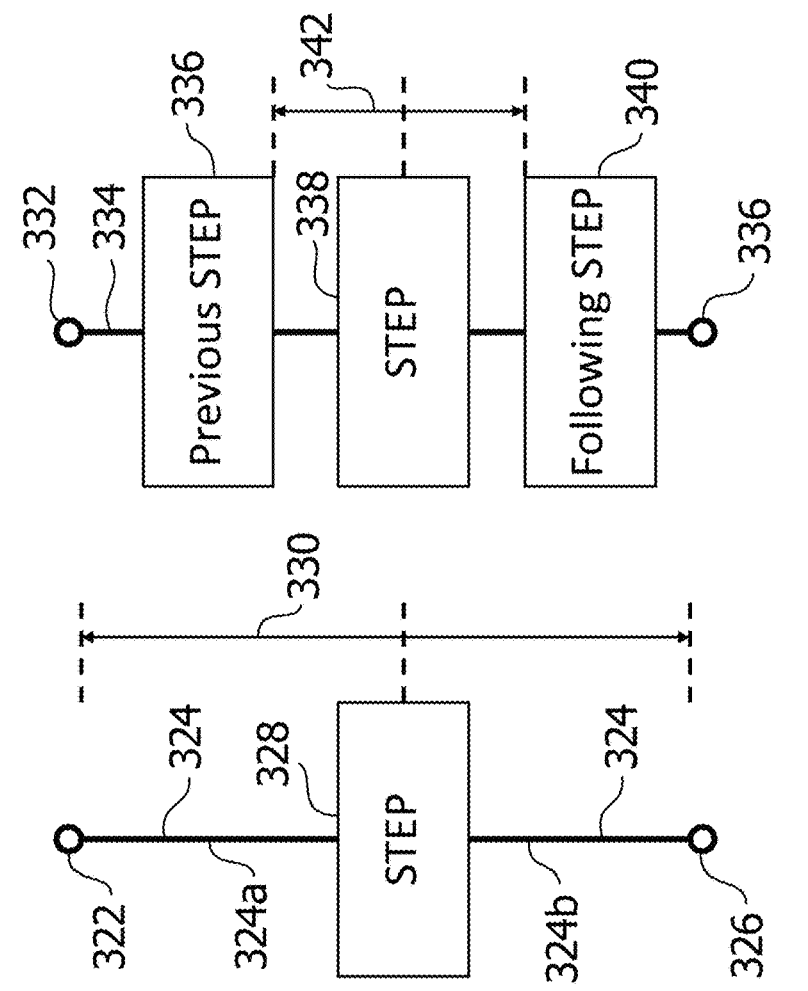

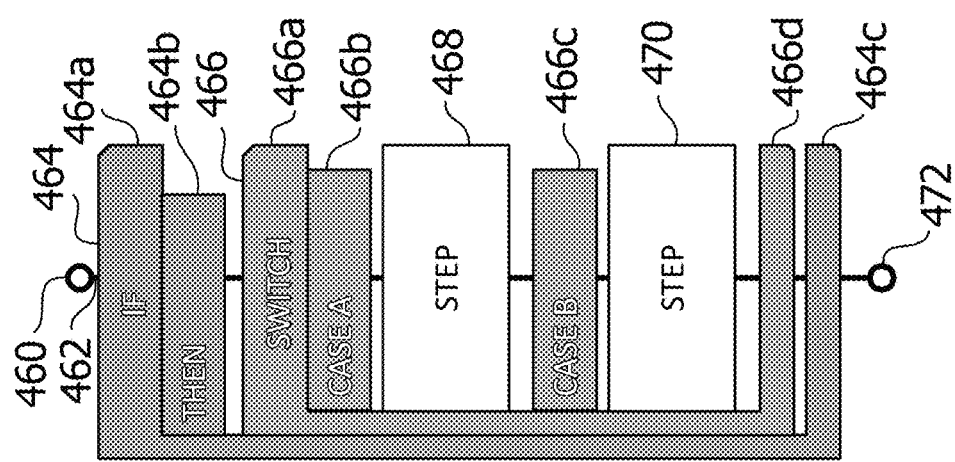
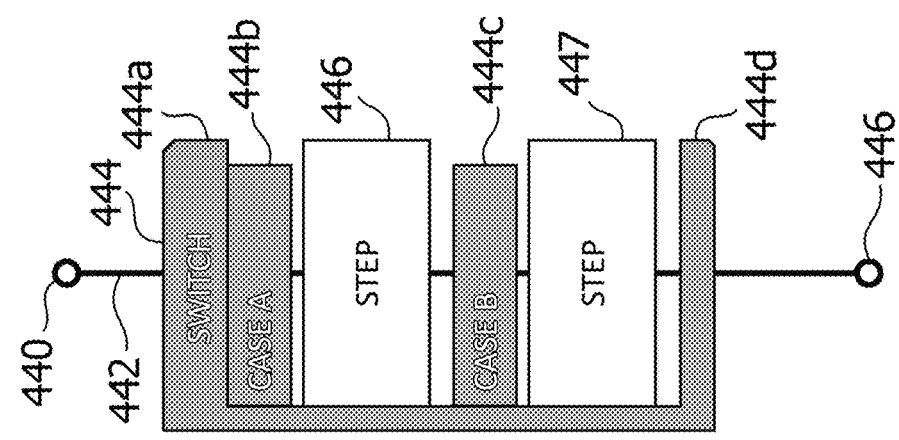
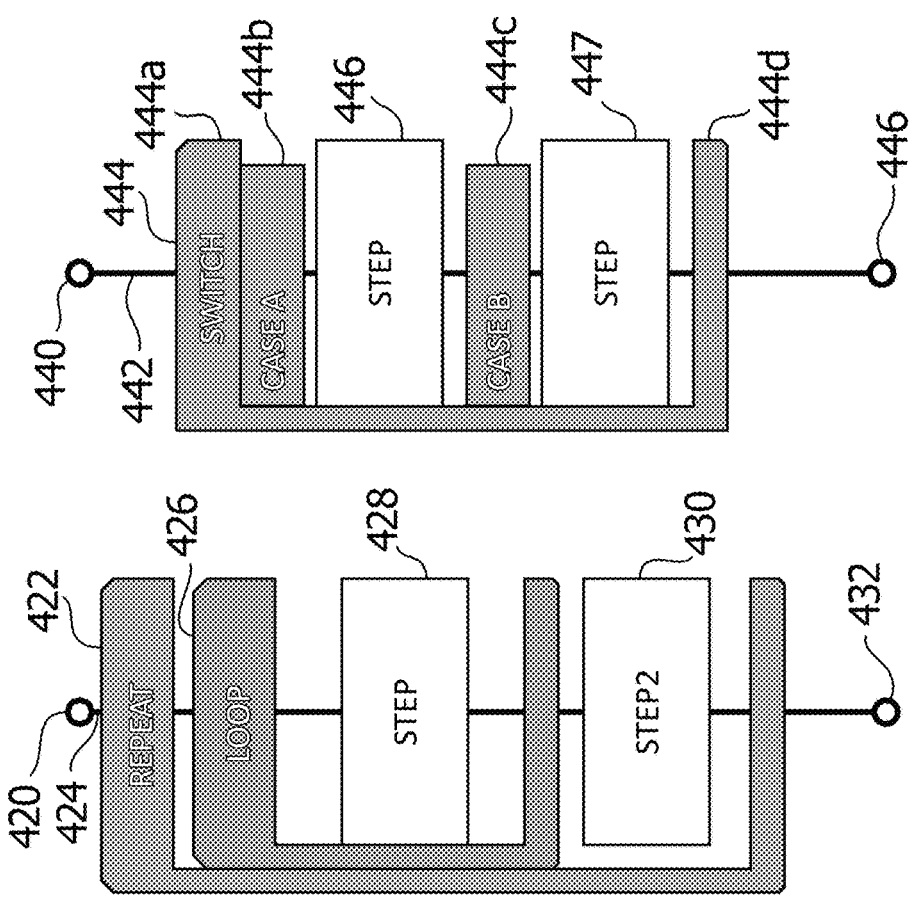
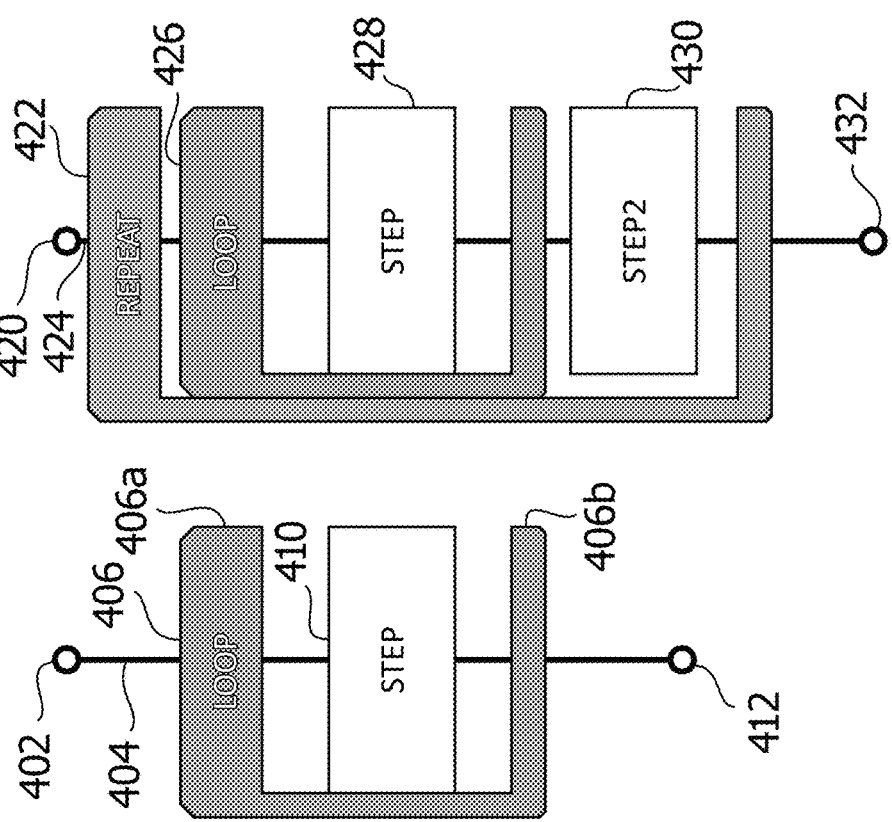

FIG.27A

```csharp
using System;
using System.Collections.Generic;
using System.Linq;
using System.Text;
using Ivi.Visa.Interop;

namespace TG1B1A_VISA_demo
{
    class Program
    {
        static void Main(string[] args)
        {
            // resource manager and message-based session manager
            ResourceManager rMgr = new ResourceManagerClass();
            FormattedIO488 src = new FormattedIO488Class();
            FormattedIO488 BERT = new FormattedIO488Class();

// measurement setup
            string srcAddress = "GPIB::16";   // GPIB address of N4963A CLOCK SYNTHESIZER13.5 GHZ
            double srcFreq = 10e9;            // frequency in Hz
            string BERTAddress = "GPIB::5";   // GPIB address of N4962A SERIAL BERT 12.5 GB/S
            string BERTPattern = "PRBS7";     // PRBS pattern
            double BERTAmplitude = 0.5;       // output amplitude
            double BERTGateTime = 10;         // measurement gate time
            double BERTErrThreshold = 1e-5;   // pre-measurement error threshold
            bool   BERTErrInj = false;        // error injection
            string BERTErrInjRate = "1E2";    // error injection rate // connect to instruments
            src.IO = (IMessage)rMgr.Open(srcAddress, AccessMode.NO_LOCK, 2000, null);
            src.IO.Timeout = 2000;
            BERT.IO = (IMessage)rMgr.Open(BERTAddress, AccessMode.NO_LOCK,
                                          2000, null);
            BERT.IO.Timeout = 2000;

// setup clock
            Console.Write("N4963A CLOCK SYNTHESIZER13.5 GHZ " + srcAddress + " setup..");
            src.IO.Clear();
            src.WriteString("*RST;*OPC?", true);
            string temp = src.ReadString();
            src.WriteString(":FREQ " + srcFreq, true);
            src.WriteString(":AMPL 1 1.5", true);
            src.WriteString(":AMPL 2 1.5", true);
            src.WriteString(":AMPL 3 0.8", true);
            src.WriteString(":AMPL 4 0.8", true);
            src.WriteString(":OUTP ON", true);
            Console.WriteLine("done");
```

FIG.27B

```
// setup BERT
Console.Write("N4962A SERIAL BERT 11.3 GB/S " + BERTAddress + " setup..");
BERT.IO.Clear();
BERT.WriteString("*RST;*OPC?", true);
temp = BERT.ReadString();
BERT.WriteString(":SOUR:ROSC:SOUR EXT", true);
System.Threading.Thread.Sleep(200);
BERT.WriteString(":SOUR:ROSC:FREQ " + (srcFreq/1e6), true);
BERT.WriteString(":SOUR:PATT " + BERTPattern, true);
BERT.WriteString(":SOUR:VOLT " + (BERTAmplitude*1000), true);
if (BERTErrInj)
    BERT.WriteString(":SOUR:PRBS:IERR:RAT ERR" + BERTErrInjRate, true);
BERT.WriteString(":MOD NORM", true);
Console.WriteLine("done");

// autoalign and check for error-free operation
Console.Write("Autoalign and error check..");
BERT.WriteString(":SENS:ROSC:PHAS AUTO", true);
BERT.WriteString("*OPC?", true);
temp = BERT.ReadString();
BERT.WriteString(":SENS:ROSC:PHAS?", true);
temp = BERT.ReadString().TrimEnd('\r', '\n');
Console.Write(temp + " degrees..");
BERT.WriteString(":SENS:SWE:TIME 0.1", true);
BERT.WriteString(":TRIG:INIT", true);
System.Threading.Thread.Sleep(100);
BERT.WriteString(":TRIG:SAMP;:SENS:DATA? ALL", true);
double[] results = (double[])BERT.ReadList(
                    IEEEASCIIType.ASCIIType_R8, ",");
if (results[3] > BERTErrThreshold)
{
    Console.WriteLine("failed");
    Console.WriteLine(results[2] + ", BER: " + results[3] +
            "; bits: " + results[0] + "; errs: " + results[1]);
    Environment.Exit(1);
}
Console.WriteLine("passed");

// start measurement
Console.WriteLine(BERTGateTime.ToString() + "s BER measurement");
BERT.WriteString(":SENS:SWE:TIME " + BERTGateTime.ToString(), true);
BERT.WriteString(":TRIG:INIT", true);
bool running = true;
while (running)
{
    BERT.WriteString(":STAT:OPER:MEAS:COND?", true);
    running = ((double)BERT.ReadNumber(
                    IEEEASCIIType.ASCIIType_R4, true) == 1);
    System.Threading.Thread.Sleep(1000);

BERT.WriteString(":TRIG:SAMP;:SENS:DATA? ALL", true);
    results = (double[])BERT.ReadList(IEEEASCIIType.ASCIIType_R8, ",");
    Console.WriteLine(results[2] + ", BER: " + results[3] +
            "; bits: " + results[0] + "; errs: " + results[1]);
    if (results[2] == BERTGateTime) running = false;
}
        }
    }
}
```

| Time | DUT | Scope | Arb |
|---|---|---|---|
| | powerOn | | |
| | init | init | init |
| | | prepareAcquisition | prepareBurst(5000kHz) |
| synchronized trigger | | trigger | trigger |
| | | prepareAcquisition | prepareBurst(10000kHz) |
| synchronized trigger | | trigger | trigger |
| | | prepareAcquisition | prepareBurst(15000kHz) |
| synchronized trigger | | trigger | trigger |

METHOD OF CREATING PROGRAM FOR MEASUREMENT SYSTEM, MEASUREMENT SYSTEM THEREFOR, AND COMPUTER READABLE RECORDING MEDIUM THEREFOR

CROSS-REFERENCE TO RELATED APPLICATIONS

The present application claims priority under 35 U.S.C. § 119 from Japanese Patent Application No. 2017-131935 filed on Jul. 5, 2017. The entire disclosure of Japanese Patent Application No. 2017-131935 is specifically incorporated herein by reference.

BACKGROUND OF THE INVENTION

There is disclosed a system configured to write and control a sequence by combining commands or application programming interfaces (APIs) for controlling each function module of a measurement system by using a general-purpose procedural programming language in one of the Related Art Documents of the present invention. In this Related Art, a sub-routine, for example, can be abstracted, and various control structures including loops and/or conditional branches can be used. The program in Chapter 4.4 on pages 12 to 13 of "Agilent IVI-COM driver and VISA-COM I/O programming examples in Microsoft Visual C# Application Note", 5991-0603EN, Agilent Technologies, Inc., Jul. 30, 2012, (hereinafter referred to as Related Art Document 1), is illustrated in FIG. 27A and FIG. 27B of this specification as an example of a program in such a system.

In another Related Art, there is a system configured to perform sequencing by combining the functions of a measurement instrument in a graphical programming language. LabVIEW ("LabVIEW Getting Started with LabVIEW", 373427J-01, National Instruments, June 2013 (hereinafter referred to as Related Art Document 2)), VEE ("Keysight Technologies VEE Pro 9.32 Data Sheet", 5990-9117EN, Keysight Technologies, Aug. 3, 2014 (hereinafter referred to as Related Art Document 3)), and BenchVue ("Keysight Technologies BenchVue Software v3.7 (BV0000A) Technical Overview", 5991-3850EN, Keysight Technologies, Nov. 3, 2016 (hereinafter referred to as Related Art Document 4)) are examples of these Related Art Documents. In return for restricting a part of the flexibility of a general-purpose programming language of these Related Art Documents, a control sequence can be more intuitively illustrated by a graphical user interface. In FIG. 28, there is illustrated an example of a measurement program for a case in which a plurality of measurement resources are used in LabVIEW. A sub-routine written using a procedural programming language like that of Related Art Document 2 is used for the content of the programming step displayed on the graphic.

In yet another Related Art, there is a system configured to control a plurality of measurement instruments pre-loaded with a program based on a trigger signal generated by a sequencer. Many automated test equipment (ATE) apparatuses employ a system like that of this Related Art. US Patent Application Publication 2011/0057663 A1 (hereinafter referred to as Related Art Document 5) shows an example of such an apparatus. As another example, in FIG. 29, there is illustrated an example of programming by a vector editor illustrated in FIG. 11 of "PXI Digital Pattern Instruments Bring Semiconductor ATE-Class Digital to the Open PXI Platform", National Instruments, Feb. 14, 2017, URL: http://www.ni.com/whitepaper/53237/en/ (found on Feb. 20, 2017), (hereinafter referred to as Related Art Document 6). All the controls are listed in a chart based on a time axis of the vector editor, for example, as a reference. In particular, in many cases, an ATE is built using a sequencer that includes dedicated hardware because precise synchronization and rapid operation with many measurement resources are required. Such an ATE is based on the assumption that dedicated hardware is used, and thus has many unique restrictions. As a result, when creating a program for the ATE, the handling of various functions of the sequencer is considered to be difficult.

In yet another Related Art, US Patent Application Publication 2008/0243732 (hereinafter referred to as Related Art Document 7), there is proposed a distributed programming method applicable to a measurement system. In FIG. 30, there is shown a programming example shown in FIG. 7 of Related Art Document 7. In FIG. 30, there is shown, as an example, a user interface in which various operations of measurement instruments or measurement modules on a time axis is represented by using a two-dimensional spreadsheet, and each of control flows of the measurement instruments or measurement modules is separately written in a corresponding column. As a result, which measurement instrument or measurement module a specific operation (or task) belongs to is clearly understood from the table, and the temporal relationship of the tasks can be grasped more easily.

Even in systems having a command-based control architecture like Related Art Documents 1 to 4, there exist implementations configured to control, based on a trigger signal generated by some kind of signal source, the timing of measurement instruments or measurement (function) modules set in advance.

SUMMARY OF THE INVENTION

It is an object of the present invention to provide, in a measurement system or a method provided thereon configured to perform measurement by combining a small number of a plurality of measurement modules (which may also be a plurality of measurement instruments) fewer than a large-scale IC tester like that in Related Art Document 5 or 6, for example, a method or a measurement system related to a programming environment capable of simply constructing a program for various measurement modules through use of a diagram in which a plurality of function columns describing a program for each measurement module are horizontally arranged. As an example, up to five measurement modules may be used.

Alternatively, it is an object of the present invention to provide a programming environment that enables a user to perform programming simply by reusing simple or basic sequences defined in advance for each measurement module, and to combine composite synchronized control sequences in a few steps.

Alternatively, it is also an object of the present invention to provide a programming environment that enables the user to specify sequence customization by arranging a temporal order relationship of the control steps of each measurement module so that the positions of those control steps are different on a time axis specified in a vertical direction on horizontally arranged function columns, and to specify synchronized execution by arranging the control steps at the same height on the time axis.

Alternatively it is also an object of the present invention to provide a programming environment capable of writing loop control or conditional branch control by writing a control structure symbol that extends across one or a plurality of horizontally arranged function columns.

A method of the present invention for creating a program for controlling, when the program is executed on a measurement system comprising a first measurement module, a second measurement module, and a controller, the first measurement module and the second measurement module, the method includes:

arranging a first function column for writing a function sequence of the first measurement module;

selecting a first function sequence to be used by the first measurement module from a function sequence library;

displaying the selected first function sequence in the first function column;

arranging, adjacent to the first function column in a first adjacent direction of the first function column, a second function column for writing a function sequence of the second measurement module;

selecting a second function sequence to be used by the second measurement module from the function sequence library; and displaying the selected second function sequence in the second function column, and wherein:

the first function sequence comprising one or more first execution steps to be executed in relation to the first measurement module, and the second function sequence comprising one or more second execution steps to be executed in relation to the second measurement module.

The method of the present invention includes an embodiment, wherein one of the one or more first execution steps and the one or more second execution steps includes one of a macro execution step and a sub-routine execution step; an embodiment, wherein the one or more first execution steps are represented in the first function column by a block having one of a roughly rectangular shape and an oval shape, and the one or more second execution steps are represented in the second function column by a block having one of a roughly rectangular shape and an oval shape; and an embodiment, wherein one or more first blocks having one of a roughly rectangular shape and an oval shape representing the one or more first execution steps and one or more second blocks having one of a roughly rectangular shape and an oval shape representing the one or more second execution steps are each arranged from one of a top and a bottom of the first function column and the second function column toward another of the top and the bottom of the first function column and the second function in accordance with an elapse of time.

The method of the present invention further includes an embodiment, wherein the first function sequence includes a first upper end symbol representing a start of the first function sequence, and a first lower end symbol representing a finish of the first function sequence, wherein the second function sequence includes a second upper end symbol representing a start of the second function sequence, and a second lower end symbol representing a finish of the second function sequence, wherein the one or more first blocks having one of a roughly rectangular shape and an oval shape are arranged superimposed on a first lifeline linking the first upper end symbol and the first lower end symbol of the first function sequence, and wherein the one or more second blocks having one of a roughly rectangular shape and an oval shape are arranged superimposed on a second lifeline linking the second upper end symbol and the second lower end symbol of the second function sequence.

The method of the present invention further includes an embodiment, wherein the one or more first execution steps include a third execution step, wherein the one or more second execution steps include a fourth execution step, wherein the third execution step and the fourth execution step are arranged at a roughly equal height, and wherein the third execution step and the fourth execution step are connected by a first additional line, the method further including designating that execution of the third execution step and the fourth execution step is to start in synchronization in the measurement system; and an embodiment further including: arranging a first delay designation step between the first additional line and the fourth execution step; and designating that execution of the third execution step and the first delay designation step is to start in synchronization in the measurement system.

The method of the present invention further includes an embodiment, wherein the one or more first execution steps comprise a fifth execution step, and the method further including designating, by arranging a left side of a second block having one of a roughly rectangular shape and an oval shape representing a second delay designation step to abut a right side of a first block having one of a roughly rectangular shape and an oval shape representing the fifth execution step, waiting until execution of a slower step among the fifth execution step and the second delay designation step has ended; and an embodiment, wherein the one or more first execution steps comprise a sixth execution step, the method further including: displaying, from an upper side of a block having one of a roughly rectangular shape and an oval shape representing the sixth execution step, a second additional line that is parallel across a column for global control adjacent in a second adjacent direction that is opposite to the first adjacent direction of the first function column; and designating, by designating a first elapsed time to be displayed near an end portion of the second additional line in the column for global control, an elapsed time from start of the program until start of the sixth execution step.

The method of the present invention includes an embodiment further including: arranging, in the first function column, a first control symbol for representing one of a loop of global control and a conditional branch of global control in a column for global control adjacent in a second adjacent direction that is opposite to the first adjacent direction of the first function column, the first control symbol comprising at least a first tip and a second tip having different heights, the first control symbol being arranged so that a height of the one or more first execution steps is included in a range defined between the height of the first tip and the height of the second tip; and designating the one or more first execution steps in association with an operation of the first control symbol for global control; an embodiment, wherein the first control symbol is for displaying at least a second additional line and a third additional line extending parallel to each other from at least the first tip and the second tip across the first function column and the second function column to clarify an execution step associated with the operation of the first control symbol; and an embodiment further including: arranging, in the column for global control, a second control symbol for representing one of a loop and a conditional branch, the second control symbol comprising at least a third tip and a fourth tip having different heights from each other, the second control symbol being arranged so that the first control symbol is included between the third tip and the fourth tip; and designating the first control symbol in association with an operation of the second control symbol.

The method of the present invention includes an embodiment further including: arranging, in the first function column, a third control symbol for representing one of a loop and a conditional branch, the third control symbol comprising at least a fifth tip and a sixth tip having different heights from each other, the third control symbol being arranged so that the one or more first execution steps are included between the fifth tip and the sixth tip; and designating the one or more first execution steps in association with an operation of the third control symbol; and an embodiment further including: arranging, in the first function column, a fourth control symbol for representing one of a loop and a conditional branch, the fourth control symbol comprising at least a seventh tip and an eighth tip having different heights from each other, the fourth control symbol being arranged so that the third control symbol is included between the seventh tip and the eighth tip; and designating the third control symbol in association with an operation of the fourth control symbol.

A measurement system of the present invention includes:
a first measurement module;
a second measurement module; and
a controller configured to control the first measurement module and the second measurement module, and wherein:
the controller includes:
a first processor;
a first memory accessible from the first processor; and
a first timer accessible from the first processor,
the first measurement module includes:
a second processor;
a second memory accessible from the second processor; and
a second timer accessible from the second processor,
the second measurement module includes:
a third processor;
a third memory accessible from the third processor; and
a third timer accessible from the third processor,
the first processor, the second processor, and the third processor being connected to each other by a data line,
the first timer, the second timer, and the third timer being connected to each other by a synchronized control line, and
the controller includes:
a first function column including one or more execution steps of a first function sequence to be executed by the first measurement module; and
a second function column including one or more execution steps of a second function sequence to be executed by the second measurement module, the second function column being adjacent in a first adjacent direction of the first function column.

The measurement system of the present invention includes an embodiment, wherein execution of a first execution step of the first function sequence and a second execution step of the second function sequence is designated by arranging the first execution step and the second execution step at a roughly equal height in the first function column and the second function column, and connecting the first execution step and the second execution step to each other by a first additional line for representing synchronized execution, and
wherein the first processor is configured to cause:
the first timer to control the second timer and the third timer; and
the second processor to execute the first execution step and the third processor to execute the second execution step in synchronization.

A non-transitory computer-readable program recording medium of the present invention has an instruction stored therein to execute any one of the above-mentioned methods when being executed on the controller.

BRIEF DESCRIPTION OF THE DRAWINGS

FIG. 3A, FIG. 3B, FIG. 3C, and FIG. 3D are diagrams for illustrating graphical representations of function sequences according to the embodiment of the present invention.

FIG. 4A, FIG. 4B, FIG. 4C, and FIG. 4D are diagrams for illustrating graphical representations of control structures according to the embodiment of the present invention.

FIG. 27A and FIG. 27B are illustrations of source code showing a program example according to Related Art of Related Art Document 1

Figure 29:
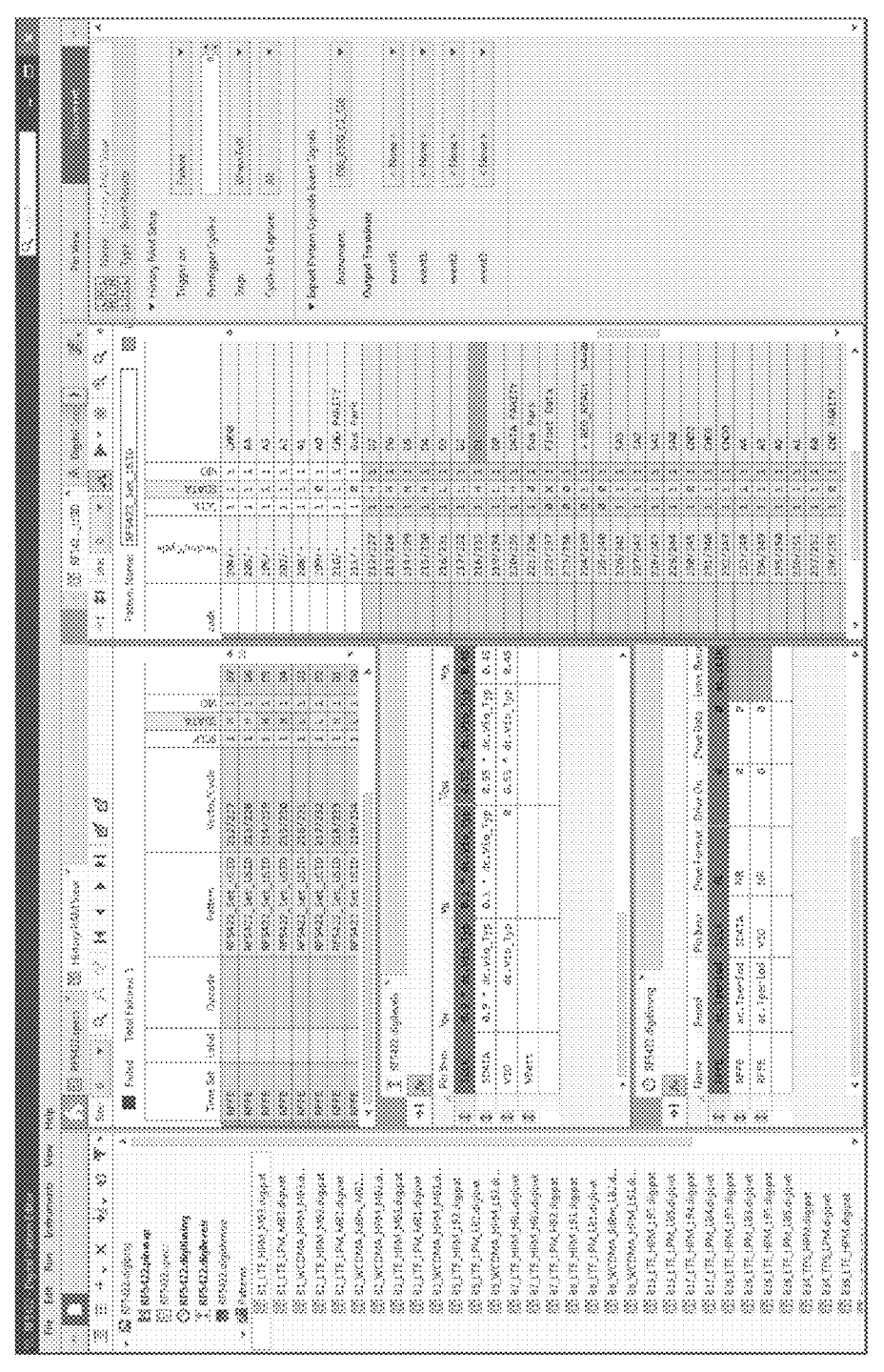

FIG. 29 is an illustration of a programming example according to Related Art of Related Art Document 6.

FIG. 30 is an illustration of a programming example according to Related Art of Related Art Document 7.

DETAILED DESCRIPTION OF THE PREFERRED EMBODIMENTS

Figure 1:
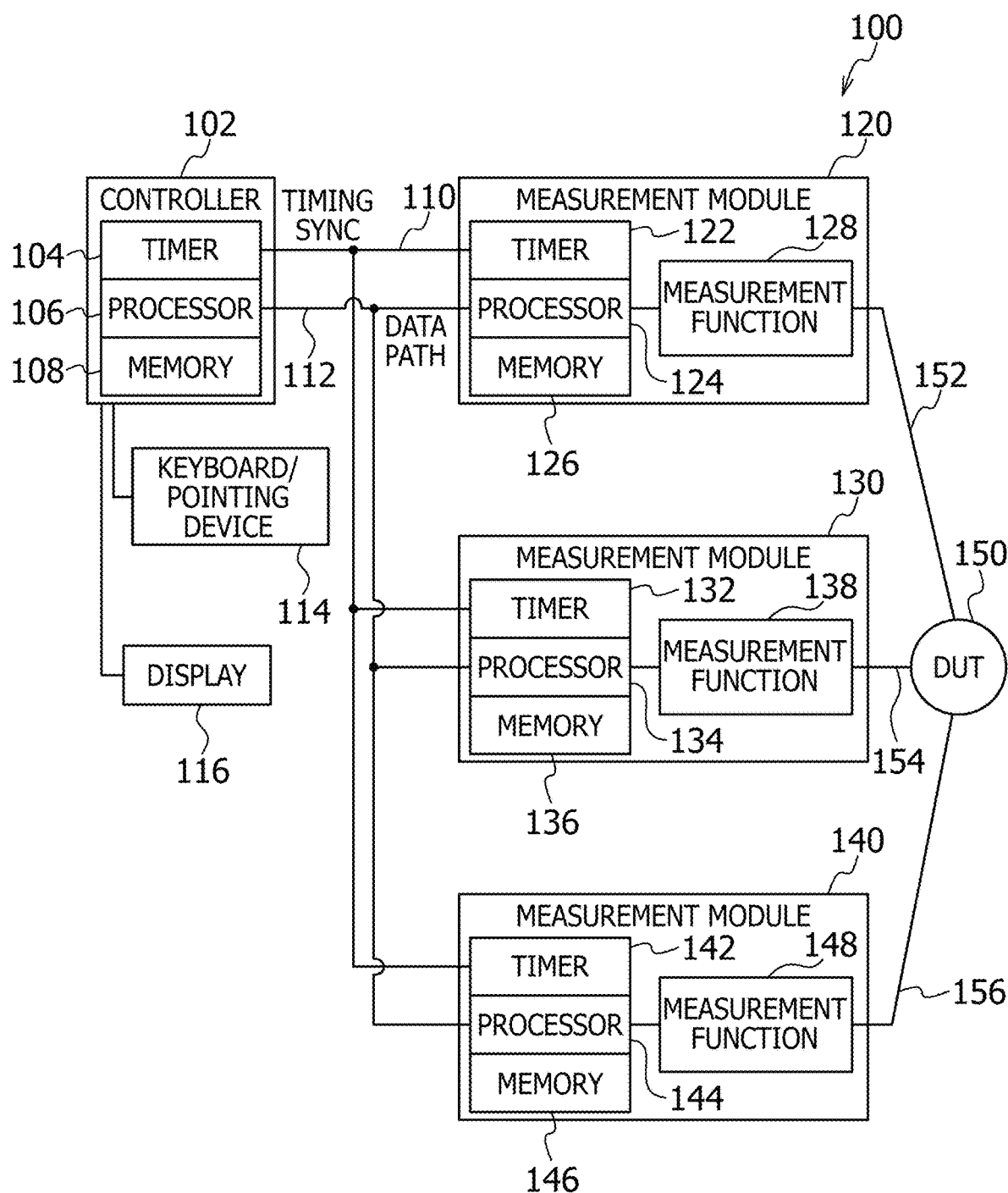
FIG. 1 is a block diagram of a measurement system according to an embodiment of the present invention.

Now, exemplary embodiments of the present invention are described with reference to the drawings. When the same functions or elements having the same content are used in other diagrams, those functions or elements are denoted by the same reference numerals.

In the following detailed description, for purposes of explanation and not limitation, representative embodiments disclosing specific details are set forth in order to provide a thorough understanding of the teachings of the present inventions. Descriptions of known devices, materials and manufacturing methods may be omitted so as to avoid obscuring the description of the example embodiments. Nonetheless, such devices, materials and methods that are within the purview of one of ordinary skill in the art may be used in accordance with the representative embodiments.

Generally, it is understood that the drawings and the various elements depicted therein are not drawn to scale. Further, relative terms, such as "on", "under", "above," "below," "top," "bottom," "upper," "lower," "left," "right," "vertical" and "horizontal," are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be "below" that element. Likewise, if the device were rotated 90 degrees with respect to the view in the drawings, an element described as "vertical," for example, would now be "horizontal."

It is to be understood that certain terminology defined herein is only for the purpose of illustrating particular embodiments, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to within acceptable limits or degree.

As used in the specification and the appended claims and in addition to its ordinary meanings, the term 'approximately' or 'roughly' means to within an acceptable limit or amount to one having ordinary skill in the art.

The processor described later may be one or a plurality of microprocessors capable of performing programming by using software (e.g., a program) in order to execute the various functions described in this specification, or may be a microcontroller, an application-specific integrated circuit (ASIC), or a field-programmable gate array (FPGA).

The term "memory" described later generally refers to one or a plurality of storage media. For example, the memory may be a volatile or nonvolatile computer memory, for example, a random-access memory (RAM), a read-only memory (ROM), a programmable ROM (PROM), an erasable programmable read-only memory (EPROM), an electrically erasable PROM (EEPROM), a universal serial bus (USB) drive, a floppy disk, a compact disc, an optical disc, and a magnetic tape. The memory may be configured to store programs and/or data to be used by the processor. In this specification, the memory is used together with the processor, and may be configured for what is known as a computer to execute one or a plurality of the programs for executing one or more of the functions discussed in the specification. In addition, the memory in this specification may include a non-transitory computer-readable program recording medium for storing the above-mentioned program.

The programming style of a procedural programming language on Related Art Documents 1 to 4 is a centralized control type configured to execute and control programs on a host computer or a main controller. When a plurality of measurement instruments (or in some cases measurement modules) are used together, it is necessary to write in the program a sequence in which the commands or the APIs for controlling those measurement instruments are arranged in time series order. Many combinations are possible for the arrangement method in accordance with the needs of each of the application programs.

In general, although there are many applications for various measurements, the program sequence for each specified measurement instrument is usually not very different. However, in the main computer configured to control the measurement system, the control sequences relating to the plurality of measurement instruments are written in an integrated manner, and thus, the sequences include a mixture of control steps for the plurality of measurement instruments. As a result, there are many variations in the sequences because the sequences can be written so as to be executed in various orders. Therefore, it is difficult to reuse the control sequence written for the application program.

As a result, hitherto, in a measurement system, the only reuse blocks available have been an element-based control step (i.e., individual control commands or APIs) included in a basic sequence, or a completed application program block for a specific application, and thus, the degrees of fineness for reusable blocks are significantly different. An element-based control step is not directly linked to the purpose of the measurement for the user. Therefore, in order to reuse an element-based control step, it is necessary to spend time on the design so that the measurement sequence can be commonly used on another application. On the other hand, a completed application program is strongly linked to a specific purpose, and it is necessary to add changes to the portions that do not match the intention of the user. Thus, in order to create an application program which facilitates reusing, a deep understanding of the operation principles and applications of the measurement instruments is necessary.

In the Related Art mentioned above, there are problems as follows.

Complexity of Programming on Time Axis

In the control based on the sequencer of Related Art Documents 5 and 6, the programming using a vector editor is a programming in which real-time synchronized operations are written using a sequencer in a hardware-oriented manner. This type of programming allows programs to be executed with a high degree of timing precision, but it is known that there are many restrictions in the programming of a sequencer having hardware specialized for a specific function. Two representative restrictions are now described. A first restriction is that due to hardware restrictions, the types of measurement instrument control commands that can be implemented on the sequencer are restricted, and moreover, those control commands are restricted to simple functions. For example, it is not possible to use the advanced function blocks provided in Related Art Documents 1 to 4 (e.g., storage of measurement results in a file or a database, numerical conversion of setting values or measurement values, composite measurement steps including a plurality of steps or conditional branches) or to use various repetitive controls or conditional branches. A second restriction is that with the user interface (UI) provided by the ATE, editing work for moving a specific event up or down on the time axis is not easy. The main reasons for this are that the time axis is represented in the sequencer program by vectors in which the unit of the time axis is a sequence rate determined based on the memory restrictions of the ATE, and thus, an operation for implementing an offset from a desired real time cannot be directly performed, and that, together with the deletion or addition of an event, a waiting vector needs to be embedded, and the editing work for embedding the waiting vector is not easy.

Difficulty of Real Time Control

With the control implemented by the procedural programming language of Related Art Documents 1 to 4, an execution order of the commands and a wait time between the commands can be programmed, but a real time execution function for executing the commands to match an elapsed time from a program start time is not provided. However, there are also applications in which time information is important in order to capture a cause-and-effect relationship clearly in the measurement of an actual physical phenomenon. Therefore, when performing synchronization for a plurality of measurement instruments, it is required to guarantee time accuracies not only for measurements, but also for applying signals.

Trade-Off Between Programming Flexibility and Time Reproducibility

As described below, there is always a large trade-off depending on which of two control architectures is selected. Specifically, such architectures can be broadly divided into architectures in which command-based control is performed by a computer or a master measurement instrument, and architectures in which trigger control is performed by a sequencer. The former architecture is capable of advanced, flexible program control but has no time reproducibility accuracy. The latter architecture has a high degree of time reproducibility accuracy, but a low level of usable programming control.

Reuse of Existing Program Library

The table-based sequence creation of Related Art Document 7 may be considered as solving a part of the problems described above. However, in this Related Art, it is necessary for the user to program and input the sequences from scratch, and hence, there is a heavy burden on the user.

Next, the representative embodiment of the present invention is described.

In a nod of the drawbacks discussed above for Related Art Document 7, the inventor of the present invention discovered that for the user of a measurement instrument, programming is merely one of means for implementing what the user wishes to do, and that the user may not necessarily want to perform all of the programming work. In other words, the inventor of the present invention discovered that when a program suited to the application to be performed by the user has been prepared in advance, an environment enabling that program to be used is desired. The inventor of the present invention also discovered that the items the user wants to customize are a "parameter setting" and an "execution timing setting" of "function blocks", which have a substantive meaning to the work to be performed by the user, and that a programming environment enabling such settings to be flexibly customized is desired.

More specifically, the inventor of the present invention discovered that it is desired that the user interface be simpler and more intuitive than the table-based user interface presented by Related Art Document 7, and that an environment, in which "function blocks" prepared in advance are selected from an existing program library and the "parameter setting" and the "timing setting" in the function blocks can be easily customized, and is easy to operate as desired.

A function column type sequence programming environment and a function column diagram of the present invention, and a measurement system based on such a programming environment and function column diagram, are now described.

Sequence Language Outline

The sequence language to be used in the embodiments of the present invention is for specifying a sequence of measurement operations including a dependent relationship among a plurality of measurement modules. The sequence is represented by graphical elements. In the present invention, the measurement sequence is written in the following manner on a function column diagram displayed on the user interface.

In the function column programming environment of the present invention, readability of a program has priority over placing restrictions on the arrangement of the program elements. In the function column programming environment of the present invention, the capability of representing the order relationship of the operations of the measurement modules is important. Therefore, for a block which represents a program element, a specific side or aspect of the block and a positional relationship of the blocks have significant meanings.

The function column programming environment of the present invention is one type of domain-specific language environment specific to implementation of a simple measurement sequence focused on data acquisition. The function column programming environment does not aim to implement all the functions that are implemented by a general programming language. The function column programming environment is not suited to writing complex algorithms, in comparison to the same measurement programmed by a general programming language, and is rather an environment suited to highly abstract high-level programming. In particular, regarding data processing, quite simple numeric operations are expected to be represented within such a programming framework, but implementing a numeric algorithm constructed from a plurality of steps by a sequence language is not expected. The data is expected to be sent to a different programming environment, and processed on that environment.

A typical task used in the function column programming environment of the present invention is to execute a basic measurement sequence by using a plurality of measurement modules or measurement instruments each including an inexpensive basic function, and to collect the measured data in a format like Excel (trademark) or a database, for example. A task including a slightly more advanced algorithm, like repetitive measurement (search measurement) including determination of a measurement value based on certain conditions and conditional branches may also be written in that environment, but such a task is not considered to be the principal application.

Regarding Structure of Specification Description

First, the graphical structural elements (i.e., basic steps, function sequences, control structures on a lifeline, subsequently-added control structures, and graphical element time representations and restrictions thereof) forming the basis of the specification of the sequence language according to the present invention are defined. Next, a definition, structure, and usage method of the function column diagram upon which the definitions of those elements are based, the relationship between the function columns and the function sequences, and the representations of measurement value data reference in the control structures are described. Lastly, what kind of operations are performed by the user to create the program using those elements, that is, the creation procedure of the function column program, is described.

Basic Steps

A basic step is a collection of one or more execution steps (i.e., above-mentioned commands or APIs) among execution steps constructing a measurement sequence based on a given measurement module. In general, a basic step does not need to be divided up so that each step is handled individually. The term "basic step" refers to a sub-sequence based on a group of one or more execution steps desired to be handled as a single unit on the function column diagram of the present invention.

Such a basic step can also be thought of as a sub-sequence of execution steps that may be sequentially executed. A basic step can also be thought of as a macro-style step (macro execution step) of a group of detailed execution steps, or as an execution step of a sub-routine. For example, in a voltage measurement sequence of a voltage measurement module, the basic steps are basically constructed from a basic step for setting a measurement mode and connecting to a device, a basic step for measuring one sample of the voltage, and a basic step for disconnecting from the device. The voltage measurement sequence can be constructed so as to execute those basic steps in order.

A definition of the graphical representations of the basic steps is now described with reference to FIG. 2A to FIG. 2G.

Figure 2G:
FIG. 2A, FIG. 2B, FIG. 2C, FIG. 2D, FIG. 2E, FIG. 2F, and FIG. 2G are diagrams for illustrating graphical representations of basic steps according to the embodiment of the present invention.
Figure 2D:
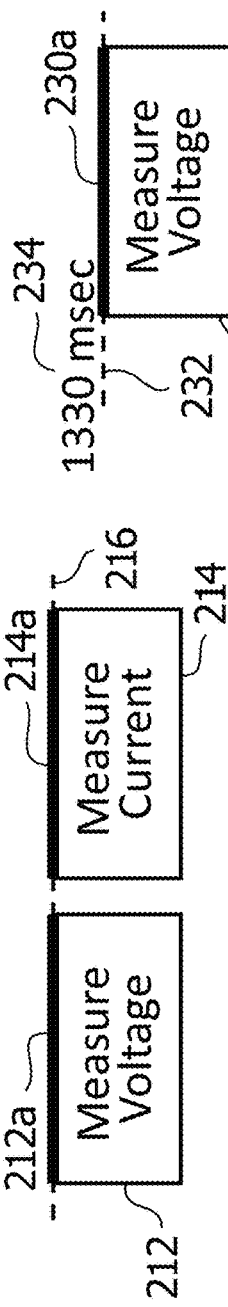
Figure 2E:
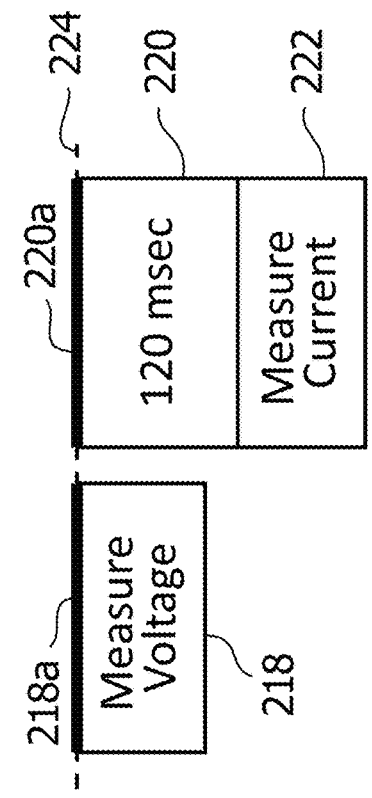
Figure 2F:
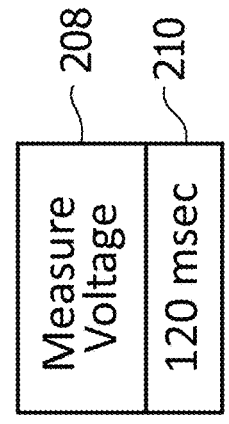
Figure 2A:
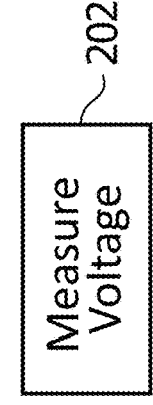

(1) Basic Step (with No Time Attribute) (FIG. 2A)

A basic step with no time attribute is the most fundamental representation of the basic step, and its title is written in a box icon or a roughly rectangular block 202. In this example, a label "Measure Voltage" is displayed as a label representing the content of the measurement step, indicating that voltage measurement is to be performed. The box icon representing the basic step may also be a shape that is roughly like a rectangle, or may be an oval shape.

Figure 2B:
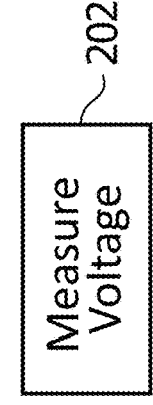

(2) Basic Step (with Time Attribute) (FIG. 2B)

The fact that a restriction is placed on the execution start time of this basic step is indicated by displaying a thick line 204a in a highlighted manner on an upper side or upper edge of a box icon 204 of the basic step. The basic step in the format illustrated in FIG. 2B is not used alone, and it is used together with a time designation method illustrated in any one of FIG. 2D to FIG. 2G, which are described below.

Figure 2C:
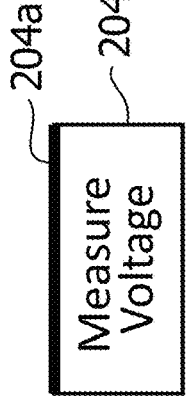

(3) Delay Designation Before or After Execution of Basic Step (FIG. 2C)

In FIG. 2C, there is illustrated a representation when designating a wait time immediately after execution of the basic step by directly connecting and arranging a delay (wait time) designation execution step on a lower side or lower edge of the basic step Measure Voltage 208. In FIG. 2C, it is illustrated that a wait time of at least 120 msec is secured (210) from the time point at which the basic step 208 called Measure Voltage is complete.

In this example, the delay designation step is a special execution step capable of expanded use of designating a delay operation relating to synchronized operation among a plurality of measurement modules, like those used in FIG. 2D and FIG. 2E described later. In FIG. 1, which is described later, the delay designation step is a special execution step in which a timer included in a plurality of measurement modules may be used, and hence the delay designation step is not considered a basic step, and is represented in this manner independently.

As a variation of FIG. 2C, the fact that the basic step is to be executed after the designated wait time has elapsed may be represented by directly connecting and arranging a delay designation step on an upper side or upper edge of the basic step. For example, a delay designation step 220 and a basic step 222 arranged vertically in FIG. 2E, which is described later, are examples of such a variation. Operation of those steps is performed by executing the basic step Measure Current 222 after the 120 msec designated by the delay designation step 220 has elapsed.

(4) Synchronized Execution (Simultaneous Execution) (FIG. 2D)

In FIG. 2D, basic steps 212 and 214 relating to a plurality of measurement modules are illustrated as being simultaneously executed by synchronizing start timings of those basic steps 212 and 214 with each other. In order to indicate that time restrictions 212a and 214a on an upper side or upper edge of the box icon are linked, the display of the positions in the vertical direction of the upper side or upper edge of the time restrictions 212a and 214a are adjusted so as to match, and an additional line (i.e., a dashed line 216) for emphasizing that those positions match is drawn so as to overlap with the upper side or upper edge. The user operation for creating such a state is described later (hereinafter the same).

(5) Synchronized Execution with Delay Designation (FIG. 2E)

Synchronized execution with delay designation is a representation combining a delay designation step, which is an example of the expansion described in relation to the delay designation of FIG. 2C, with the basic step of FIG. 2D described above. In FIG. 2E, by arranging the wait time designation execution step 220 before the basic step 222, which is not illustrated in FIG. 2C, it is represented that the basic step 222 is to be executed after the designated wait time (120 msec) has elapsed. In FIG. 2E, it is also represented that, based on that fact that the time restrictions 218a and 220a of the upper side or upper edge of the box icon are represented by being connected to each other by an additional line 224, the basic step "Measure Voltage" 218 and the delay designation step 220 are to start in synchronization with each other, and that the basic step "Measure Current" 222 is to start 120 msec after those steps have started (220).

(6) Synchronized Execution or Waiting of Basic Step and Timer (FIG. 2F)

As another combination of a basic step and a delay block, the basic step and the delay block can be arranged horizontally. When arranging the basic step and the delay block horizontally, in order to show the relationship between them in an easy to understand manner, a right side or right edge of the basic step and a left side or left edge of the delay block are brought into contact with or into abutment with each other, and highlighted displays 226a and 228a are arranged on the upper side or upper edge for indicating that there is a time restriction. This description represents waiting for the slower of completion of the basic step "Measure Voltage" 226 and the elapse of 1,200 msec (228). In this case, in general, the lifeline, which is described later, extends above and below the basic step 226 when the lifeline is displayed.

(7) Time Designation (FIG. 2G)

The elapsed time from the program start can be designated as a start time of the basic step. To represent this, in addition to the highlighted display 230a at the upper side or upper aspect indicating the time restriction of a basic step 230, the left end of an additional line 232 is extended until a column for global control, which is described later, on the left edge of the previous diagram, and a start time 234 is written near the left end of the additional line 232. As a combination with the representation of FIG. 2D, the start of each of a plurality of basic steps may also be linked to the same time.

Function Sequence

A function sequence is a representation mode for clearly representing the operation of the program sequence to be executed for a given measurement module by using the above-mentioned basic steps, graphical elements, which are described later, and loops, conditional branches, or other such control structures, which are also described later. The graphical elements to be used in the definition of the function sequence are now described.

In FIG. 3A to FIG. 3D, as the graphical elements required in order to define the function sequence, a lifeline is defined and a usage example of such a lifeline is described below. The lifeline lengthens and shortens in the vertical direction. The unfilled white circles indicating the upper end and the lower end of the function sequence respectively represent the start and the end of the function sequence, and in terms of time, respectively represent a start time and an end time. The arrangement of the sequence of basic steps on the lifeline defines the order in which those basic steps are to be executed. The time restrictions are based on the above-mentioned time restriction rules defined in each of the basic steps.

(1) Lifeline (FIG. 3A)

A lifeline 304 is represented as a vertical line segment. In this example, the passage of time is represented as proceeding from top to bottom. Unfilled white circles 302 and 306 at the upper end and the lower end respectively represent the start and the end of the function sequence, and in terms of time, respectively represent the start time and the end time of the function sequence. In the following description, it is not always necessary for the execution time of the first basic step and the start time of the function sequence to match. It is also not always necessary for the execution completion time of the last basic step and the end time of the function sequence to match. The positions of the upper end and the lower end of the lifeline can be freely moved up or down on the function column diagram, which is described below, and the lifeline itself may also be appropriately lengthened or shortened in conjunction therewith.

(2) Typical Measurement Sequence (FIG. 3B)

A typical measurement sequence is represented by upper and lower ends 312 and 316, a time-series arrangement of a series of basic steps 318, 320, and 322, and lifelines 314a, 314b, 314c, and 314d, which link the upper and lower ends with each of the basic steps. In order to avoid the complication, it is not allowed for the basic steps to overlap.

The lower side or lower edge of one basic step may be arranged abutting the upper side or upper edge of the following basic step. In such a case, this means that immediately after completion of the upper side basic step, the following basic step on the lower side is executed.

When the basic steps are arranged apart from each other, as in FIG. 3B, except for when another time designation has been issued, the execution times of those basic steps are treated as being undefined. This means that only the order is defined, that is, after a preceding basic step is complete, the following basic step is executed.

(3) Movable Range (Lifelines) of Basic Steps (FIG. 3C)

When a basic step 328 is present between lifelines 324a and 324b, as in FIG. 3C, the basic step 328 may be moved to a freely chosen position (indicated by arrow 330) between the upper end of the lifeline 324a and the lower end of the lifeline 324b by lengthening or shortening the lifelines 324a and 324b. In the following description, the representation regarding such an arrangement represents that the basic step 328 is to be arranged superimposed on one lifeline 324, and the basic step 328 is to be arranged at a freely chosen position across a range 330 on the lifeline 324.

(4) Movable Range (Range Restriction by Previous and Following Steps) of Basic Steps (FIG. 3D)

A basic step 338 in the middle of FIG. 3D can be movably arranged up or down a lifeline 334 across a range 342 until the basic step 338 comes into contact with the previous basic step 336 or the following basic step 340.

Whether or not an operation for adding or deleting a basic step other than those described above to the function sequence is permitted may be defined as a tool design policy separate to the definition of the graphical elements. As described later, such operations are not permitted in a basic embodiment of the function column programming environment. The reason for this is that an operation that adds or deletes a basic step substantially greatly changes the role and the content of the function sequence.

For the same reason, operations for exchanging the order of the basic steps on the lifelines are also prohibited in the basic embodiment of the function column programming environment. Therefore, the movable range of the basic steps is until the basic step to be moved comes into contact with the previous or following step, as illustrated in FIG. 3D, or reaches the upper or lower end of the lifeline.

In the case of a function sequence for a plurality of measurement modules, there is a lifeline column for each measurement module, and there is a basic step on each lifeline column. The temporal relationship when the basic steps of the plurality of measurement modules are to be executed is written based on the vertical positional relationship between a given basic step in a given lifeline column and another basic step of another lifeline column. That temporal relationship is defined and represented on the function column diagram, which will be described later.

Control Structures on Lifeline

In the function sequence of the present invention, control structures like the following are defined in order to repetitively execute or conditionally execute a sub-sequence including one or more sequential basic steps on a single lifeline. The control structures may be thought of in the same manner as in a general programming language. The graphical representations of the control structures are described below with reference to FIG. 4A to FIG. 4D.

(1) Loops

In the graphical representation representing a loop control, which represents repetitive execution control of a specific sub-sequence of the function sequence, an interval of the specific sub-sequence to be subjected to loop control is enclosed by a C-shaped symbol 406 in FIG. 4A. Execution steps locating between two tips of the C-shaped symbol are affected and controlled by the loop control. The C-shaped symbol represents the four corners of an outer frame as a cut-out symbol. The visibility of the control structure symbols, for example, the symbol 406, may be improved by changing the color or the type of hatching for each control structure. A text label indicating the content of the loop may be displayed in a head portion 406a of the loop. It is not always necessary for the type of loop control (e.g., FOR, REPEAT, WHILE, etc.) to be written in the label. Freely chosen text that is easily understood by the user may be written. A method for setting the details of the loop is described later. In FIG. 4A, a reference symbol 406b represents an end portion of the loop, and a reference numeral 410 represents a basic step included in the loop.

(2) Nested Loop

As illustrated by the inclusive structures denoted by symbols 422 and 426 in FIG. 4B, loop nesting is represented by encompassing one loop structure 426 within another loop structure 422. The nesting may be made more visible by changing the color or the type of hatching with a nesting label of the loop.

(3) Conditional Branch

As illustrated in FIG. 4C, the representation of a conditional branch is also represented by using a C-shaped symbol. In a conditional branch symbol 444, of the four corners of the C-shaped symbol, two cut-outs or notches are set only in the right side corners in order to distinguish from the loop structure symbol. Two tips of the C-shaped symbol have a similar meaning of the affected range to the above loop control. A label may be written in a head 444a of the conditional branch symbol 444. Similar to FIG. 4A, it is not always necessary for the type (IF, SWITCH, etc.) of the conditional branch to be represented as a label. Content may be represented in an unfilled portion in the C-shaped symbol for each conditional clause. For the conditional branch of FIG. 4C, two conditional clauses exist. The conditional clauses include labels 444b and 444c, and sub-sequences 446 and 447. FIG. 4C is an example of a case in which the conditional branch 444 includes a freely chosen number of one or more SWITCH statements, that is, sub-sequences. Each branch condition may be written in the labels 444b and 444c of the conditional clauses. A reference symbol 444d represents an end portion of the conditional branch 444.

(4) Nested Conditional Branch

As illustrated in FIG. 4D, nesting of a conditional branch is also represented in a similar manner to FIG. 4B. A C-shaped conditional branch symbol represents a nested structure by wrapping around from an external side. The nesting may be made more visible by using a color or hatching that is different depending on the nested label. In FIG. 4D, a separate conditional branch SWITCH structure 466 is written in a conditional clause THEN 464b of a conditional branch IF structure 464. The conditional branch structure 466 includes conditional clause CASE A portions (466b and 468) and conditional clause CASE B portions (466c and 470).

A feature of the control structures of the language used to perform the control sequences of the present invention like those described above is that the loop label and the condition label attached to the control structures are all in free text, and may be written as freely chosen character strings. Therefore, it is acceptable for "IF" to be written as the control type in the conditional branch label, but free text like "in case of a 4-terminal device", for example, may also be displayed. The details of the actual conditional branch setting are hidden in the background as an advanced setting (to be described later). As a result, the content of the program can be grasped more intuitively.

In order to avoid the complication, the sub-sequences arranged on a lifeline and enclosed by the above-mentioned control structures cannot use a part of the time restriction. More specifically, in a general embodiment, the designation (all designations including absolute time as well as synchronization with other basic steps) of the execution start time of those control structures cannot be used. For the sub-sequences enclosed by the control structures as well, the designation (all designations including absolute time as well as synchronization with other basic steps) of the execution start time of each basic step cannot be used. However, delay (FIG. 2C) of the previous and following basic step, synchronized execution with delay (FIG. 2E), and timer waiting (FIG. 2F) can be used.

When there is a control structure on each of a plurality of lifelines, and the ranges in which those control structures are present are overlapping in a time axis direction, the temporal relationship of the basic steps in relation to each other cannot be defined. Even when control is repetitively performed, timing reproducibility for each repetition of the sub-sequence is basically not guaranteed.

Subsequently-Added Control Structure

The control structures on the lifelines described in the above sections are intrinsic and integral elements in terms of constructing the function sequence. However, there are cases in which it is desired to subsequently add a control structure to all or a part of the function sequence based on the intentions of the user. Such a control structure may be considered as being, on the function column diagram described later, subsequently added in a limited manner on each function column lifeline, or subsequently globally added in a form that covers all of the lifelines operating in parallel. In this section, those subsequently-added control structures are comprehensively described.

The fact that the control structures on the lifelines described in the above sections are intrinsic and integral elements in terms of constructing the function sequence is shown based on the following specific examples. In the case of a function sequence for a sweep measurement, that measurement can be broadly considered as being constructed from three basic steps, that is, 1) connection and setting of the measurement resources, 2) repetitive measurement (repetition of voltage setting and current measurement sub-sequences), and 3) disconnection of the measurement resources. Of these, item 2) can be represented by a loop control structure on a lifeline. Considering that the function sequence is no longer a sweep measurement when the loop control structure of item 2) is removed, the loop control structure can be regarded as being intrinsic and integral to the function sequence.

Similarly, when some kind of control structure, for example, a loop or a conditional branch, is subsequently added to the function sequence, depending on the position at which that control structure is subsequently added, it can be easily imagined that the intrinsic meaning of the function sequence may be destroyed. The simplest example of a control structure capable of being added to the sweep measurement function sequence described as an example without destroying the intrinsic meaning of that function sequence is to add a loop in a form that encompasses the entire function sequence, that is, encompasses the upper and the lower ends of the lifeline. Another example is to add another layer of a loop or a conditional branch that encompasses the entire sub-sequence of item 2). However, the intrinsic meaning of the sweep measurement is impaired when a control structure is arranged between the voltage setting and the current measurement of item 2).

On the other hand, a global control structure may be introduced as a so-called control structure for the entire program, in which a plurality of function sequences to be executed in parallel on the time axis are all uniformly valid. In other words, a global control structure may be subsequently used in order to loop a part of the entire program, or to skip or branch a part of the entire program. In FIG. 5A to FIG. 5D, graphical representations of such a global control structure are illustrated.

Figure 5A:
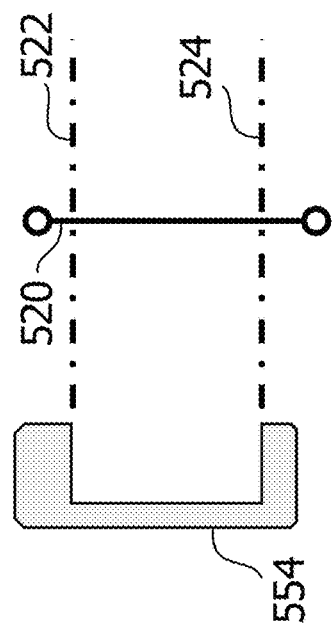
FIG. 5A, FIG. 5B, FIG. 5C, and FIG. 5D are diagrams for illustrating graphical representations of global control structures according to the embodiment of the present invention.

(1) Wait Point on Lifeline (FIG. 5A)

When a new control structure is to be subsequently added to an existing function sequence, the positions at which the new control structure can be subsequently added are limited due to the need to maintain the intrinsic meaning of the function sequence. The reasons this is so are as described above. In order to show on the lifeline the positions where a control structure can be subsequently added to the function sequence, wait points 502 and 506 may be added to the lifeline. In FIG. 5A, the wait points are represented by a symbol of a filled circle on the lifeline. On the display tool of the function column diagram, which is described later, the wait points 502 and 506 may be displayed only when necessary. This is because from the perspective of a user who does not need subsequent addition of a control structure, having multiple wait points that can be seen on the lifeline looks complex and can become a cause for confusion. When wait points are to be defined, it is necessary to define at least two or more wait points on the lifeline. When three or more wait points are to be defined, it is necessary to clearly show corresponding wait point pairs. Those wait point pairs may be shown in different colors, for example, in order to enable each pair to be identified.

Figure 5B:
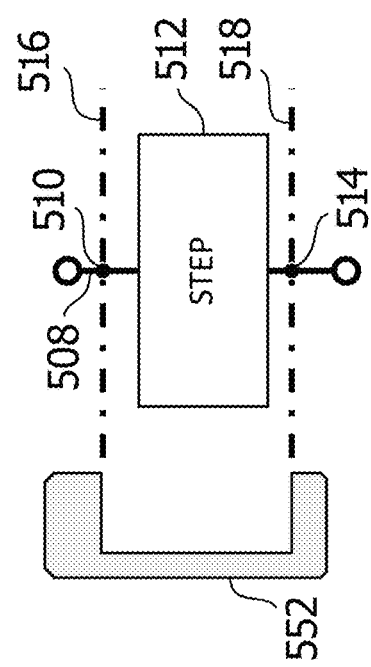
Figure 5C:
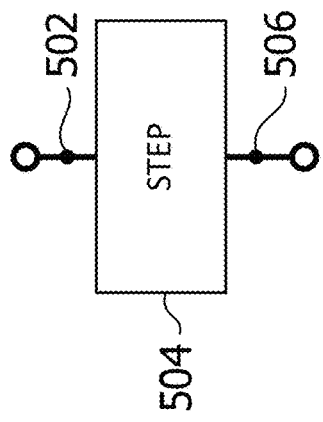

(2) Condition for Drawing Global Wait Line (FIG. 5B and FIG. 5C)

As illustrated in FIG. 5B, a global wait line is denoted by at least two dashed-dotted lines 516 and 518. When the global wait lines 516 and 518 cut across a lifeline 508, operation of the function sequence relating to the lifeline 508 for the portion between those global wait lines is affected by a branch operation determined by a global control structure 552. Specifically, for example, that portion is affected by whether a specific sub-sequence is to be executed or to be skipped based on a conditional branch or a loop condition determination. In this way, it is required that all of the function sequences of an area enclosed by the global wait lines be executed in accordance with a single conditional branch determination by the global control structure 552. The global control structure 552 may include two or more global wait lines.

The condition for allowing the global wait lines 516 and 518 to validly cut across the lifeline 508 is when any one of the conditions of FIG. 5B or 5C is satisfied. First, in FIG. 5B, there is illustrated an example in which one or more basic steps (in the example illustrated in FIG. 5B, only one basic step 512) exist on the lifeline 508 between the two global wait lines 516 and 518. It is necessary for both of those two global wait lines 516 and 518 to cut across wait points 510 and 514.

Next, in FIG. 5C, there is illustrated an example in which not even one basic step is present in a portion between, of a lifeline 520, two global wait lines 522 and 524 in a global control structure 554. In other words, in FIG. 5C, there is illustrated an example in which the global wait lines 522 and 524 may validly cut across the lifeline 520 regardless of whether or not there is a wait point on the lifeline 520.

Figure 5D:
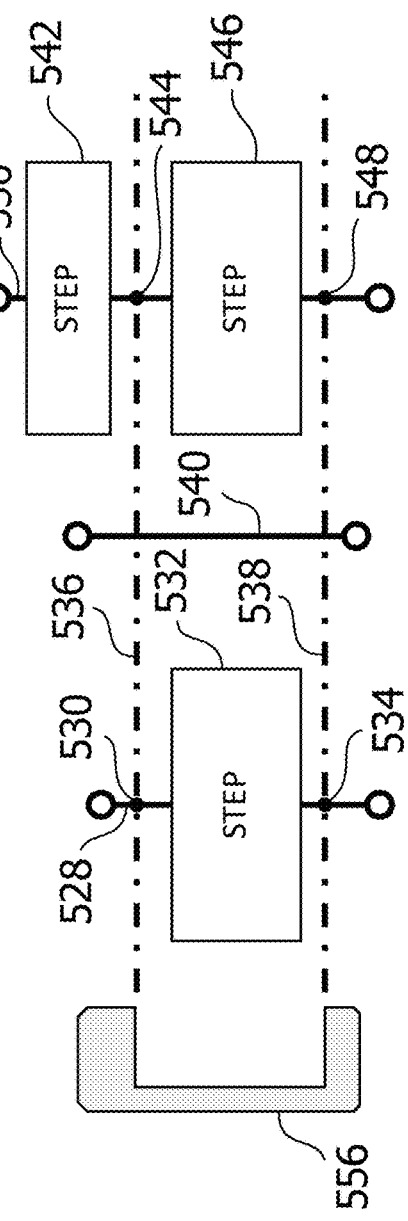

(3) Graphical Representation of Global Control Structure (FIG. 5D)

When there are a plurality of lifelines, as illustrated in FIG. 5D, a global control structure 556 is placed in a special column farthest to the left on the function column diagram, which is described later. In the right direction from the global control structure 556, at least two or more global wait lines 536 and 538 extend and are arranged across all of lifelines 528, 540, and 550 existing at the same time point. The graphical representation of the global control structure 556 is in accordance with the various types of control structures illustrated in FIG. 4A to FIG. 4D, and hence a detailed description of such graphical representation is omitted here. Similar to FIG. 4A to FIG. 4D, the global control structure itself may be nested.

In this way, with the sequence language of the present invention, when certain requirements are satisfied, a global control structure may be subsequently added to the lifelines. The global control structure is meaningful in that it exhibits an effect globally, and validly cuts across and influences all lifelines that exist in the same time period. In a representative embodiment of the function column diagram that is described later, a fairly large number of applications can be covered by just the definition of the global control structure, but in a broader sense the global control structure may be applied in applications such as the following:

(1) An application in which the lifeline is divided into a plurality of groups, and a "global" control structure valid only for each of those groups is applied. This is an application corresponding to so-called multithread programming. In terms of actual implementation, as described later, a plurality of global control columns at the left edge of the function column diagram may be prepared in accordance with the number of threads.

(2) A control structure that is valid only for one lifeline may be subsequently added to a single lifeline by using a wait point. For example, in order to enable a sweep measurement loop to be repeated a plurality of times, a loop may be duplicated through subsequent addition.

(3) An even more detailed restriction may be added to the conditions allowing a global wait line to be drawn. For example, a loop may be permitted but a conditional branch not permitted as the corresponding global control structure. Depending on the type of control structure, such a function may be used when the intrinsic meaning of the function sequence may be destroyed.

As described above, the global control structure is a necessary structure, but can become very complex when the detailed conditions are considered. Therefore, in the representative embodiment, restrained use is assumed. More specifically, wait points are defined for a function sequence only in a case in which it is certain that the intrinsic meaning of the function sequence will not be harmed no matter how the function sequence is used. Representatively, it may be regarded that wait points can be set only at a timing before and after measurement resource connection and disconnection.

Graphical Element Time Representations and Restrictions Thereof

As described above, a graphical representation of the function sequence is represented by arranging the basic steps and the control structures in series on a lifeline. The upper side or upper edge, and the lower side or lower edge, of the basic steps or the control structures represent the start and end times. This is also shown by the definition that two elements on the same lifeline arranged so that the lower side or lower edge of one element contacts or abuts the upper side or upper edge of the other element are to be sequentially executed without a gap therebetween. However, the vertical height of the graphical representation is not proportional to the absolute time. Depending on the information to be displayed in the graphical representation, the vertical height may change without any relationship to time information.

When a basic step or a control structure exists on each of two freely chosen lifelines existing in parallel, the temporal relationship of those basic steps and control structures is defined as follows. Specifically, a graphical element having a higher upper side or upper edge position starts to be executed at an earlier time. The execution order when the upper side or upper edge position looks to be equal is undefined. However, when synchronized execution is designated, it is defined that execution is to be simultaneously started within a certain time skew range (due to hardware restrictions, etc.).

The order of the graphical elements included in a control structure or a global control structure on a lifeline with respect to any graphical elements on another lifeline cannot be construed based on the position of the graphical elements regardless of whether the position relates to an upper side or upper edge, or a lower side or lower edge. It is also impossible to define synchronized execution among such graphical elements. However, as an exception, the temporal relationship of basic steps that are included in the same nested level in the same loop control structure can be defined. This is essential in order to implement a case in which a sweep measurement loop is executed by using two measurement instruments, for example.

Function Column Diagram Definition

The function column diagram is a program description form or a program description format for performing the function column programming of the present invention. In short, the function column diagram is a diagram in which the elapse of time is shown on the vertical axis, and different measurement modules are arranged in parallel on the horizontal axis. As described in the following, a plurality of function sequences are arranged on the time axis, and the temporal relationship of the execution start times of the basic steps, for example, constructing each function sequence can be adjusted relative to each other.

Function Column Diagram Structure

Figure 6:
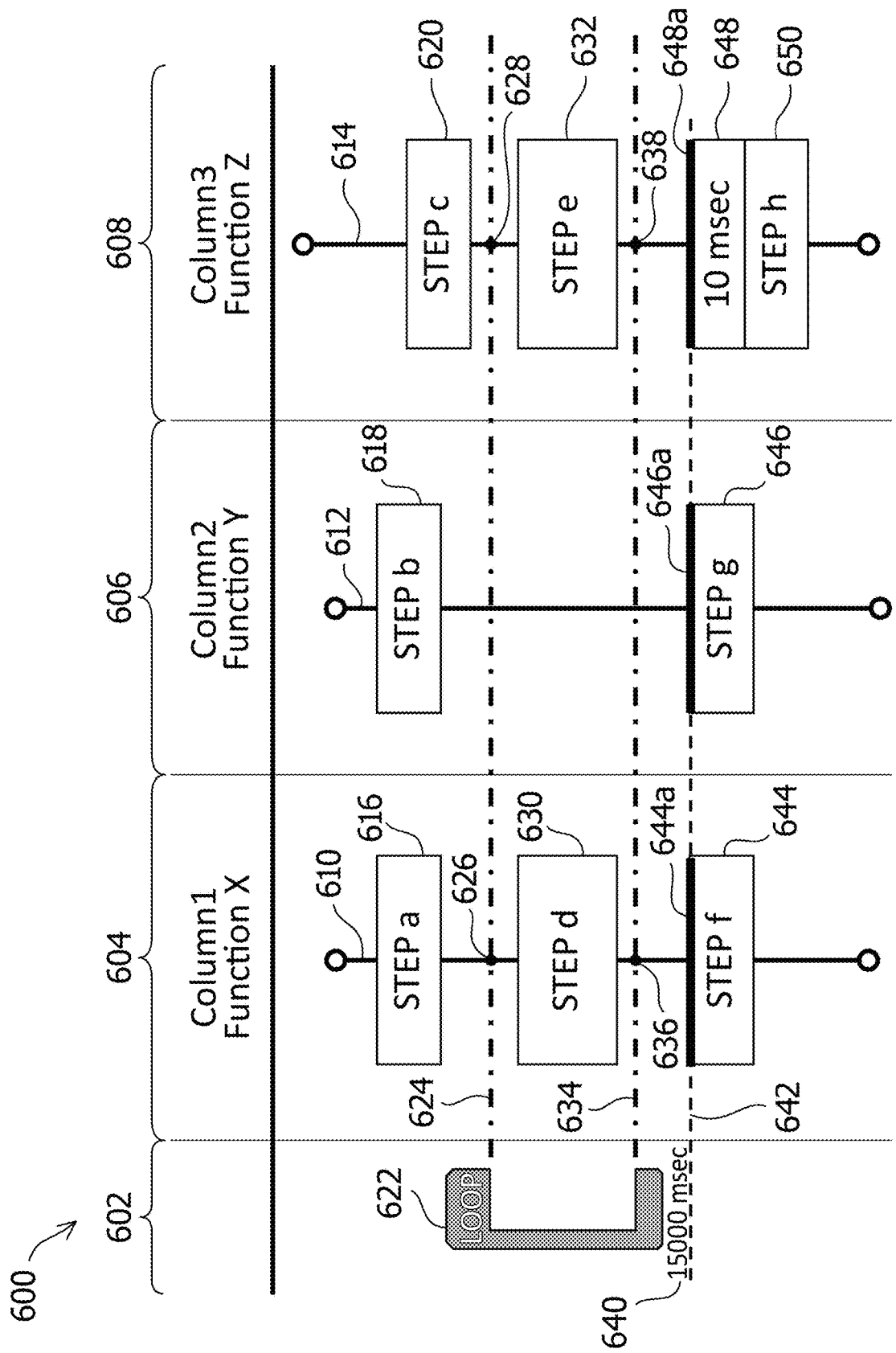
FIG. 6 is a diagram for illustrating a structure of a function column diagram according to the embodiment of the present invention.

As schematically illustrated in FIG. 6, a column 602 on the leftmost edge of the function column diagram is a column that has been allocated for global control. The elements allocated to the column 602 are, specifically, an absolute time designation and the above-mentioned global control structure. In each of the other columns, a function sequence is allocated. The second column from the left is Column 1 (604), in which the sequence of a measurement module Function X is written. The third column from the left is Column 2 (606), in which the sequence of a measurement module Function Y is written. The fourth column from the left is Column 3 (608), in which the sequence of a measurement module Function Z is written.

(1) Order Relationship of Steps a, b, and c

The upper side or upper edge of Step a 616 and the upper side or upper edge of Step b 618 appear at first glance to be even. However, even when the upper side or upper edge is completely even on the display, synchronization is not set, and hence the temporal relationship of the execution starts of those basic steps is undefined. The upper side or upper edge of Step c 620 is clearly arranged in terms of time after Steps a and b, and hence Step c is guaranteed to be executed after Steps a and b. However, note that the only thing that is guaranteed is the order, and the specific interval between execution of each of those steps is not defined. There is no relationship between the apparent height of the upper side or upper edge, or the lower side or lower edge, of the basic steps and the execution time until completion of the basic steps. For example, even for basic steps that overlap in the height direction, it is not necessarily the case that the execution of Step c 620 is started before completion of Step b 618.

(2) Steps d and e, and Global Loop

Step d 630 and Step e 630 are included in the range designated by a global loop 622, and are each executed as a loop in accordance with the setting content (which is exemplified in FIG. 23, to be described later) of the global loop 622. The temporal relationship of the start times in each repetition of Step d 630 and Step e 632 is undefined. There are no basic steps on a lifeline 612 of Column 2 (606) during the repetition interval. The following Step g 646 is executed after all the repetitions have ended. In the global loop 622, the graphical elements are placed in the column 602 for global control in accordance with the definition.

(3) Synchronized Execution of Steps f, g, and h

A delay of 10 msec before execution start is added in Step h 650 (648). Synchronized execution is defined for Step f 644, Step g 646, and a pre-delay 648 added to Step h 650 (dashed additional line 642). The synchronized execution additional line 642 extends until the column 602 for global control on the left edge, and, based on an absolute time designation 640, sets the execution start time to 15,000 msec (15 sec) after program start. Note that a time designation is not always necessary in the case of only synchronized execution. When there is no time designation, synchronized execution of the basic steps is started immediately after the above-mentioned loop has ended. The start time designation for Steps f 644, Step g 646, and a pre-delay 648 added to Step h 650 may be contradictory depending on the loop count setting, and thus, in FIG. 6, the time designation 640 is set.

Function Column Diagram Usage Method

The function column diagram is a part of the grammar accompanying the sequence language. As described in the above sections, each function column describes a measurement module or a measurement instrument including one function. In each function column, one function sequence is allocated, and only one lifeline is permitted to exist. The upper and lower ends of each function column may be moved to a desired position. When writing a long measurement program, lifelines that are not overlapping in terms of their time positions may also be defined. Areas without a lifeline on the function column indicate that the relevant function is not being used, which means that those areas are not subject to synchronization and global control. As described in the above sections, based on certain rules, the temporal relationship among the start times of the basic steps belonging to each function column can be known by using the function column diagram.

A programming tool for implementing the function column diagram needs to have at least the following functions.

(1) Adding a function column, allowing the user to select a required function sequence from a separately provided function sequence library, and linking the selected function sequence to the function column.

(2) Enabling the lifeline on the function column to be freely lengthened and shortened, or an element, for example, a basic step, on the lifeline to be moved vertically.

(3) Adding a time restriction (including synchronization) to the basic steps.

(4) Adding a subsequently-added control structure. In this case, the programming tool has a function for determining, based on certain rules, whether or not addition of the control structure is possible for the designated context, and providing the determination result as feedback to the user.

(5) Enabling predetermined graphical elements to be displayed on each element of the programming tool, and for user convenience, providing a function of organizing, rearranging, or temporarily hiding the graphical elements as necessary in a range that is equivalent in terms of meaning.

Relationship Between Function Column and Function Sequence

Each function column is based on the assumption that the function column is linked to only one function sequence, namely, one lifeline. However, a function column can be linked to a measurement module including a plurality of channels or measurement functions, and hence can be expanded so that a plurality of function sequences (i.e., lifelines) are placed therein, as long as those plurality of function sequences do not temporally overlap. This enables a longer sequence and more advanced measurement content to be represented.

Representation of Measurement Value Data Reference in Control Structures

In a control structure (including lifelines and global control structures) like a conditional branch or a loop, a determination condition that is determined directly or indirectly based on the measurement result may be used. When such a determination condition is represented as a graphical element, expansion may be performed by drawing an arrow indicating a dependence relationship, for example, from the basic step performing the measurement toward the control structure (i.e., lifeline or global control structure) including the determination condition. However, from the perspective of the inherent role of the function column diagram, that is, of showing the temporal relationship of the execution timing of the basic steps, the display content may become somewhat complicated. Therefore, in the above-mentioned embodiment of the present invention, the dependence relationship of such data can be represented without using graphical elements, but by using a reference relationship based on text language in a measurement determination expression. This representation can be performed by using means similar to using a cell number (e.g., A1, B12, etc.) for referring among cells in a general spreadsheet application.

In the graphical programming language mainly representing a data flow, for example, VEE, LabVIEW, and BenchVue, of Related Art Documents 2 to 4, both of the control flow and the dependence relationship of the data are illustrated by using lines (arrows). However, using lines (arrows) in this way can lead to the program being more difficult to understand and appearing more complex. Function column programming tries to describe the data flow and the control flow separately under its programming policy in order to make the control flow simpler and easier to understand and to enable programming that promotes reuse.

Function Column Program Creation Procedure

A flowchart for illustrating a program creation procedure 700 to be recommended as being usable by the user based on the function column programming environment provided by the present invention is now described with reference to FIG. 7.

First, in Step 702, in-advance preparation can be performed. The content of the in-advance preparation is to create a function sequence library. A main focus of the function column programming is to enable an end user of the measurement modules or the measurement instruments, in particular an engineer or a researcher who does not possess a high level of knowledge regarding programming or the measurement instruments, to quickly create the required program (sequence) by using available materials. The concept of the present invention is based on the assumption that the function sequences forming the basis of the function column programming are supplied as a library component. The function sequences include basic steps, control structures, and arrangement of wait points. Among these elements, in particular, the basic steps are the fundamental structural parts of measurement module control. The content of the basic steps is implemented by using, for example, the hardware of the relevant measurement module, and, when necessary, a programming environment based on another language. It is required that the basic steps be capable of being customized, for example, for a setting parameter. In the programming environment of the present invention, as described later, there is provided a user interface for performing such customization.

The content of the function sequences basically cannot be changed or modified by the end user. Therefore, a function having an intrinsically different meaning needs to be implemented as a separate function sequence. For example, even for function sequences for performing the same voltage sampling measurement, from the perspective of ease of understanding, it is desired that the function sequences be implemented as individual function sequences based on whether or not a storage destination of the measurement data is a file of comma-separated value (CSV) format or a database. However, the preparation of two duplicating function sequences can be avoided by preparing and implementing a customizable user interface that allows the storage destination to be selected in the measurement basic step.

Step 702 may also be executed and ended as an independent step separate from Steps 704 to 708.

Figure 25:
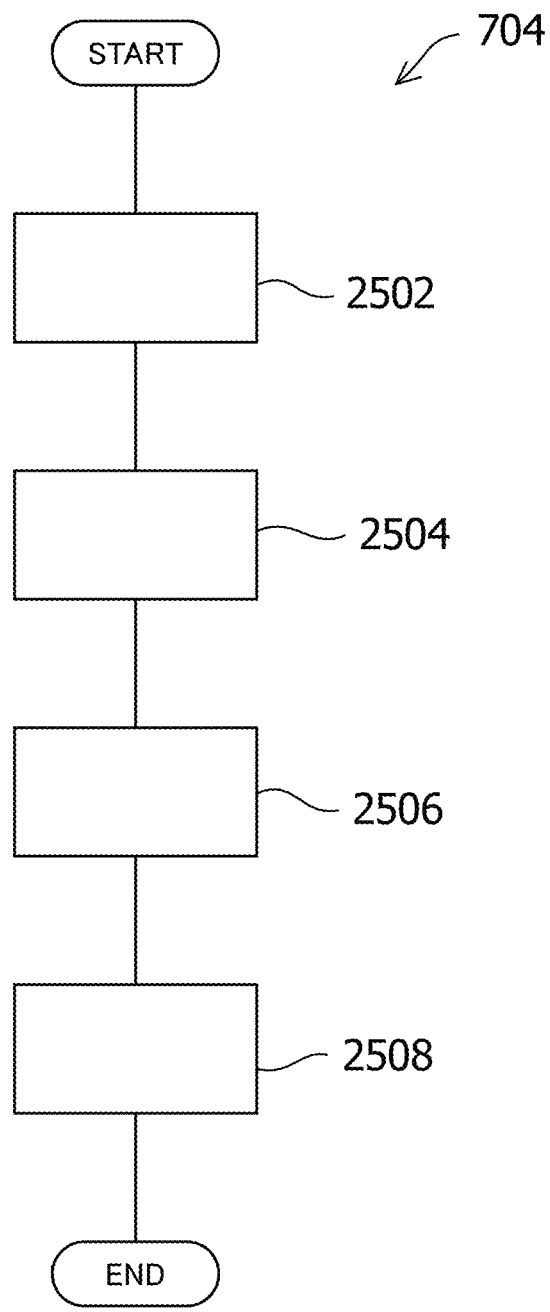
FIG. 25 is a flowchart for illustrating Step 704 of FIG. 7 in detail.

Next, in Step 704, a function sequence can be selected and added to a function column. Step 704 is described in detail later with reference to FIG. 25. Specifically, the user can add a new function column to the function column diagram (Step 2502), select the measurement module to be written in that function column from prepared candidates (Step 2504), and then select the function sequence to be used from the function sequence library prepared for the selected measurement module (Step 2506). The selected function sequence is displayed in the added function column (Step 2508).

For the function sequence to be selected by the user, a list of usable function sequences may be displayed for each selected measurement module, and the user can select a desired function sequence from the displayed list. The list of measurement modules and the list of function sequences are prepared in advance in the manner described above, and many of these lists are provided by the provider of the function column programming environment according to the present invention.

At this stage, regardless of whether or not another function column exists, the lifeline and the basic steps arranged on that lifeline are only placed at a default appropriate position. In a state in which Step 704 has ended, multiple function columns have merely been added, and synchronization and other such setting of the basic steps for the plurality of measurement modules has not yet been performed. Therefore, it is unlikely that the desired measurement sequence can be implemented.

Figure 26:
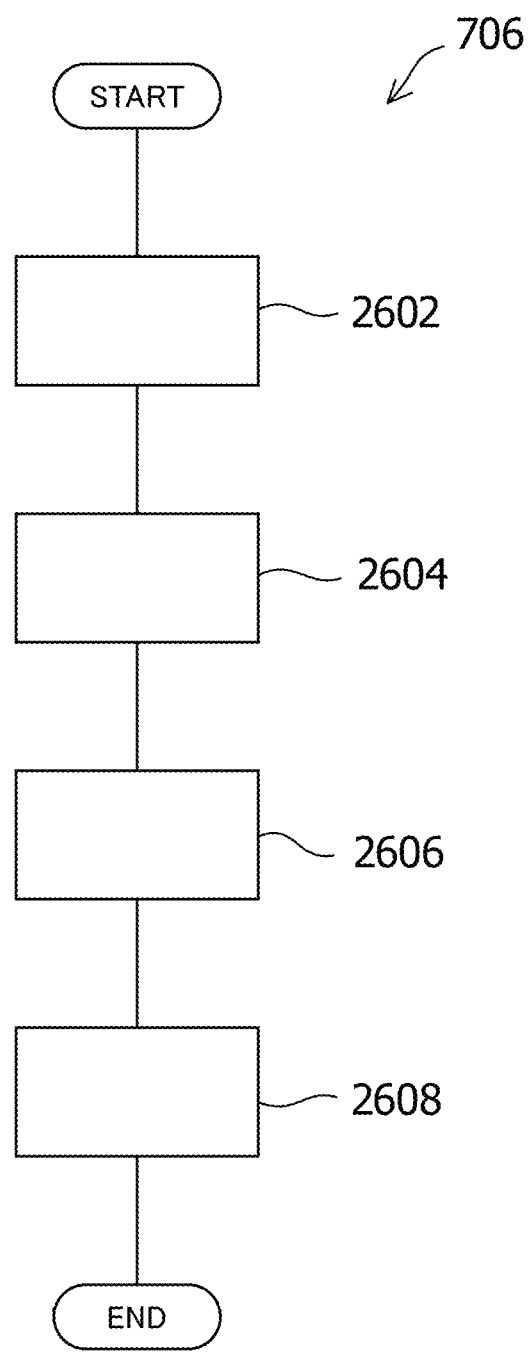
FIG. 26 is a flowchart for illustrating Step 706 of FIG. 7 in detail.
Figure 28:
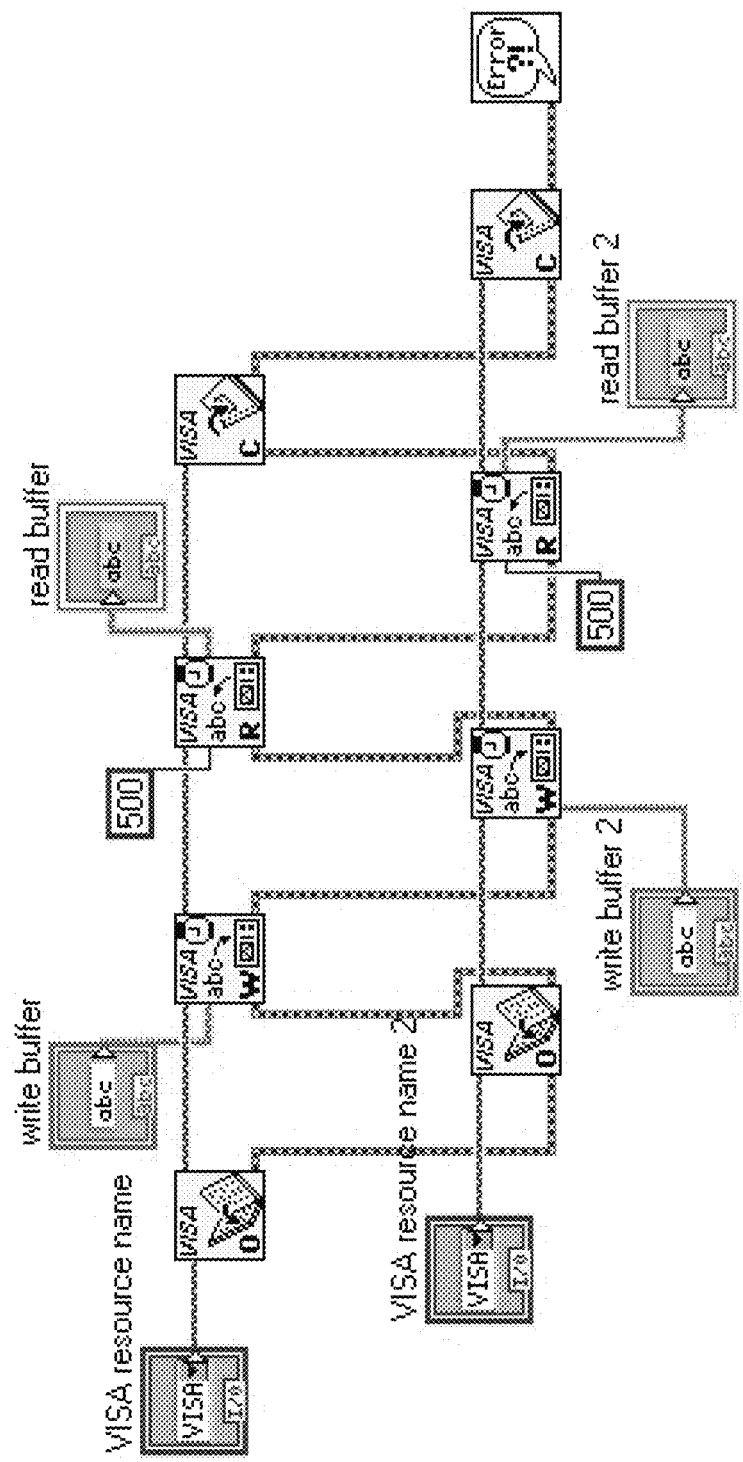
FIG. 28 is an illustration of an example of a measurement program according to Related Art of Related Art Document 2.

Next, in Step 706, the execution timing of the basic steps is adjusted. Step 706 is described in detail later with reference to FIG. 26. Specifically, the user can create a work area by lengthening the lifeline (Step 2602), arrange the basic steps so that the temporal relationship among the basic steps in the plurality of function columns is schematically appropriate (Step 2604), set advanced settings for the global control and synchronization (Step 2606), and then set the parameters of the basic steps and each type of element (Step 2608). Execution of several steps among Steps 2602 to 2608 may be omitted, and the order in which Steps 2602 to 2608 are executed may be changed.

More specifically, in Step 2602, in the function column diagram in which multiple function columns have just been added, the function sequences placed in the default appropriate positions are only arranged in parallel. Thus, the user can first perform an operation for extending the lifeline of each function sequence to an appropriate length that is suitable for the work. The length of the lifeline and the execution time of the program are not directly related, and thus, the length of the lifeline may be determined by taking into account the length thought to be sufficient for the desired arrangement predicted for the basic steps. The lifeline can then be lengthened or shortened at any time as necessary.

Next, in Step 2604, the user can roughly arrange the temporal positional relationship of each of the basic steps. The temporal relationship of the execution times is basically determined by the upper side or upper edge of each graphical element. Therefore, the user adjusts the position of the graphical elements in the vertical direction while keeping in mind the temporal relationship among the upper sides or upper edges. At this stage, various types of delay designations, like those illustrated in FIG. 2C and FIG. 2E to FIG. 2G, can be performed as necessary. Specifically, at this stage, as illustrated in FIG. 2C, FIG. 2E, and FIG. 2F, a delay designation step may be added above, below, or to the right of each basic step (however, the added delay designation step must not overlap another graphical element), an additional line can be extended from the highlighted display of the upper side or upper edge indicating the basic step time restriction until the column for global control, and the start time of that basic step can be designated by writing the start time near an end portion of the additional line.

Next, in Step 2606, the user can write a global control element in the function column diagram as necessary. Specifically, global control is subsequently added and synchronization is set. For example, it is necessary for the display to be organized so that the basic steps to be synchronized are arranged in a horizontal line with respect to a synchronization line. Therefore, the arrangement of the previous and following graphical elements on the lifeline to be affected is adjusted as necessary by using a tool.

Next, in Step 2608, each graphical element includes an advanced setting item or a conditional statement, for example, and thus, the user can set each of those to an appropriate value or option. The input method of the settings is described in detail later.

Next, in Step 708, the user can execute, debug, and store the program.

Consideration is now given to processing of the measurement data in the programming environment according to the present invention.

The function column programming according to the present invention aims to create a comparatively simple distributed control sequence of at most a few steps and a few modules based on a simple operation of determining the arrangement of the temporal relationship of the basic steps. The function column programming according to the present invention presumes a certain level of control relying on the measurement data, but is not expected to be used in advanced control based on complex calculations.

In principle, the measurement data is to be processed so as to be directly transmitted to a log file, a screen, or a database from each basic step. For that reason, a symbol or similar object indicating the flow of data is not defined in the graphical elements of the function column diagram. However, as a definition of the sequence language according to the present invention, a function may be prepared that is capable of causing an external unit not included in the basic steps or control structures to refer to the measurement data, and transmit that measurement data to another basic step or control structure.

The above-mentioned function relating to the measurement data is specifically set and used as follows. Each basic step or control structure can define in advance a parameter for the measurement data. That parameter can be designated so as to be supplied to another basic step or control structure. The user can assign to that parameter a unique identifier (ID) for identification. Data to which an ID has been assigned can be referred to from another basic step or control structure by using the ID. A basic step or control structure set in this manner is called a data source.

In contrast to the data source, a data consumer, which is an entity to receive the data, is a basic step or a control structure on another lifeline. The data consumer can refer to and read the measurement data based on an ID embedded in a parameter of the basic step or a setting parameter/conditional expression of the control structure, for example, by a method determined based on the implementation of the programming tool. The value of the parameter set in this manner is referred to during execution.

It is necessary that the temporal relationship of execution of the data source and the data consumer always be appropriately maintained. When data is to be moved between the measurement modules, it is necessary that a latency required for the movement be secured. When a circular reference of the data is predicted to occur, it may be necessary to implement error processing in such a case as well.

Figure 7:
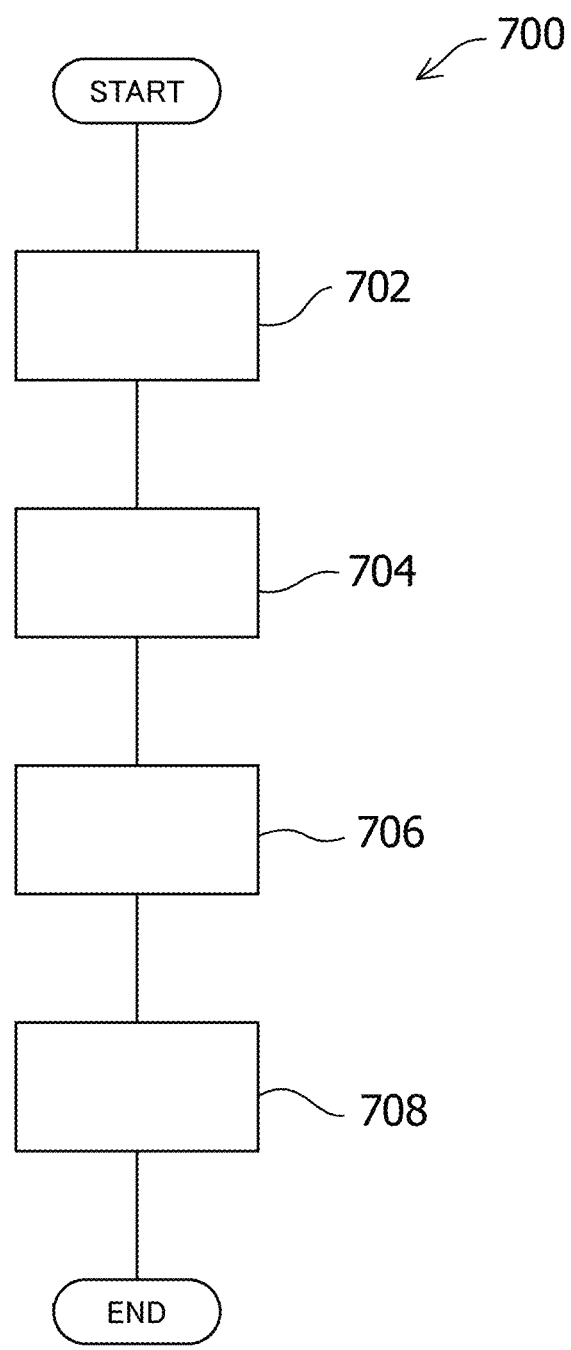
FIG. 7 is a flowchart for illustrating a program creation procedure according to the embodiment of the present invention.

Next, how programming is performed on the function column diagram according to the present invention in the flowchart illustrated in FIG. 7 is described with reference to display examples of FIG. 8 to FIG. 24.

Figure 8:
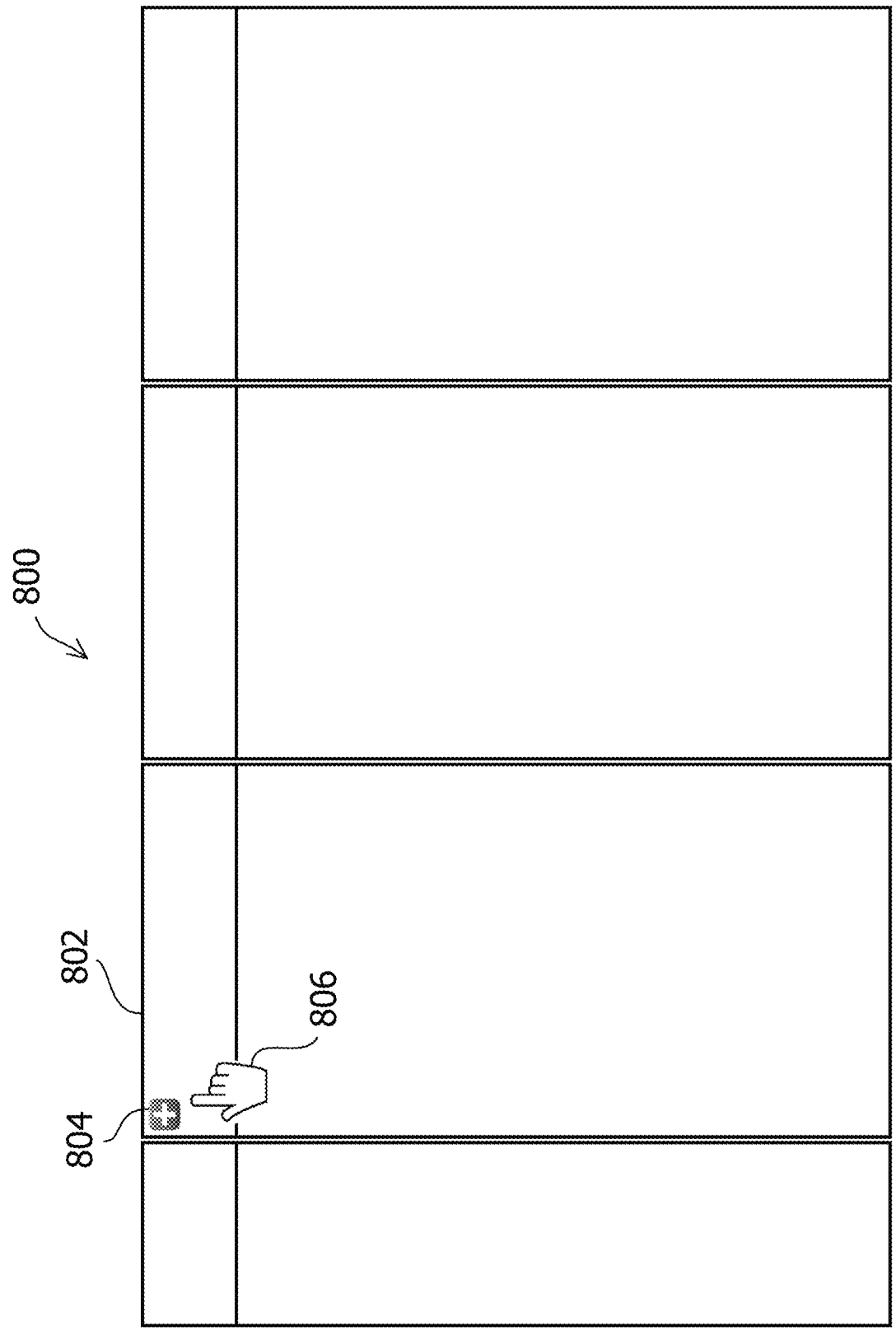
FIG. 8 to FIG. 24 are each a diagram for illustrating a programming example in the function column diagram according to the embodiment of the present invention.

In FIG. 8, there is illustrated an initial screen in which the program for a function column diagram 800 according to the present invention is not yet written. In the upper edge of a column 802 second from left, a "plus" symbol icon 804 for adding a measurement module is displayed in advance in order to prepare for the start of programming. In order to start the programming of the initial function column, a pointer 806 is moved to the upper edge of the column 802 second from the left by using a mouse or other such pointing device prepared as an input device for a main controller, and the "plus" symbol icon 804 for adding a measurement module is, for example, left-clicked with the mouse.

Figure 9:
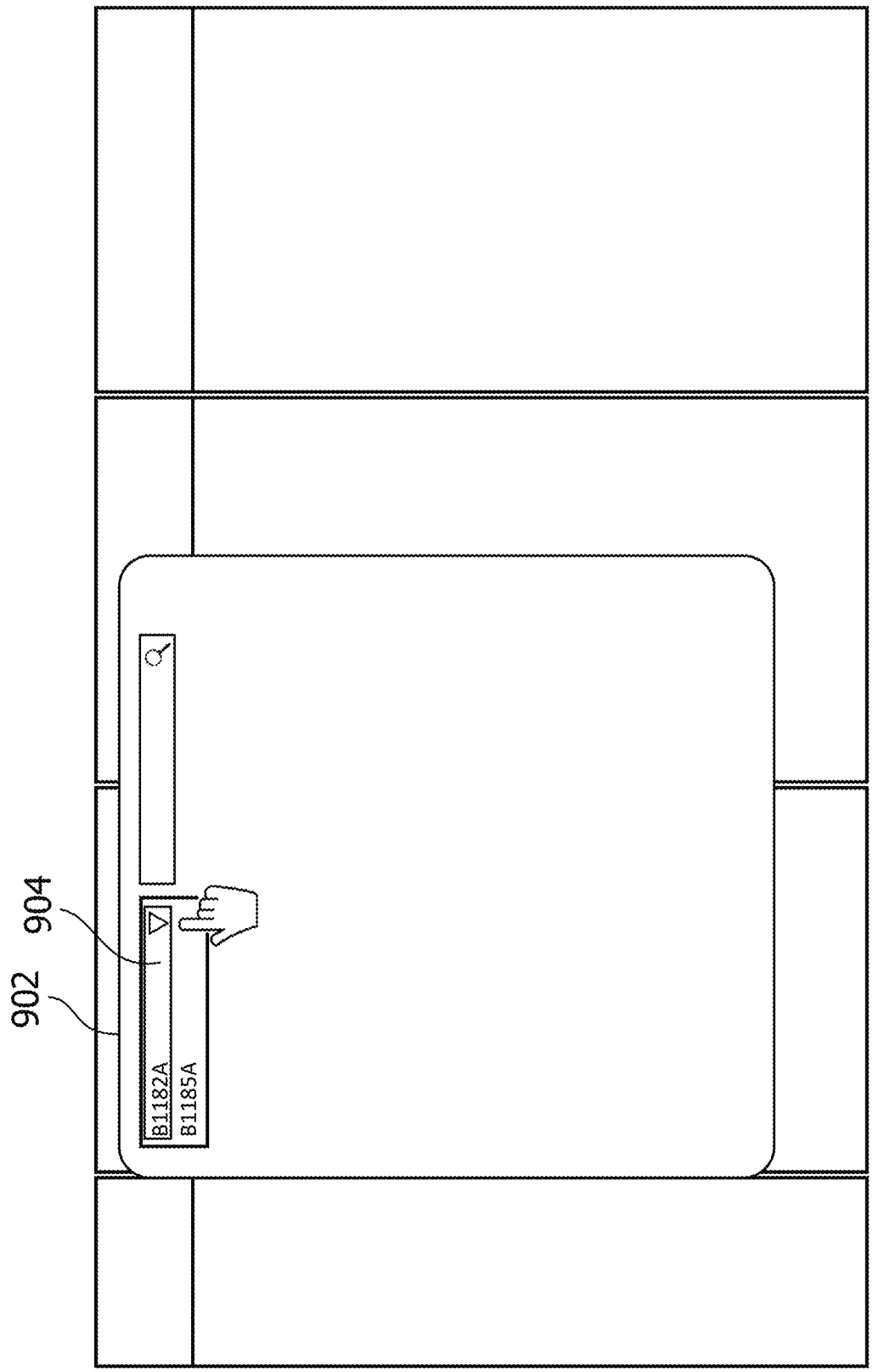

As a result, a setting window indicated as a reference numeral 902 in FIG. 9 is displayed, and by operating the mouse on a field 904 for selecting a measurement module, the desired measurement module can be selected from a pull-down list.

Figure 10:
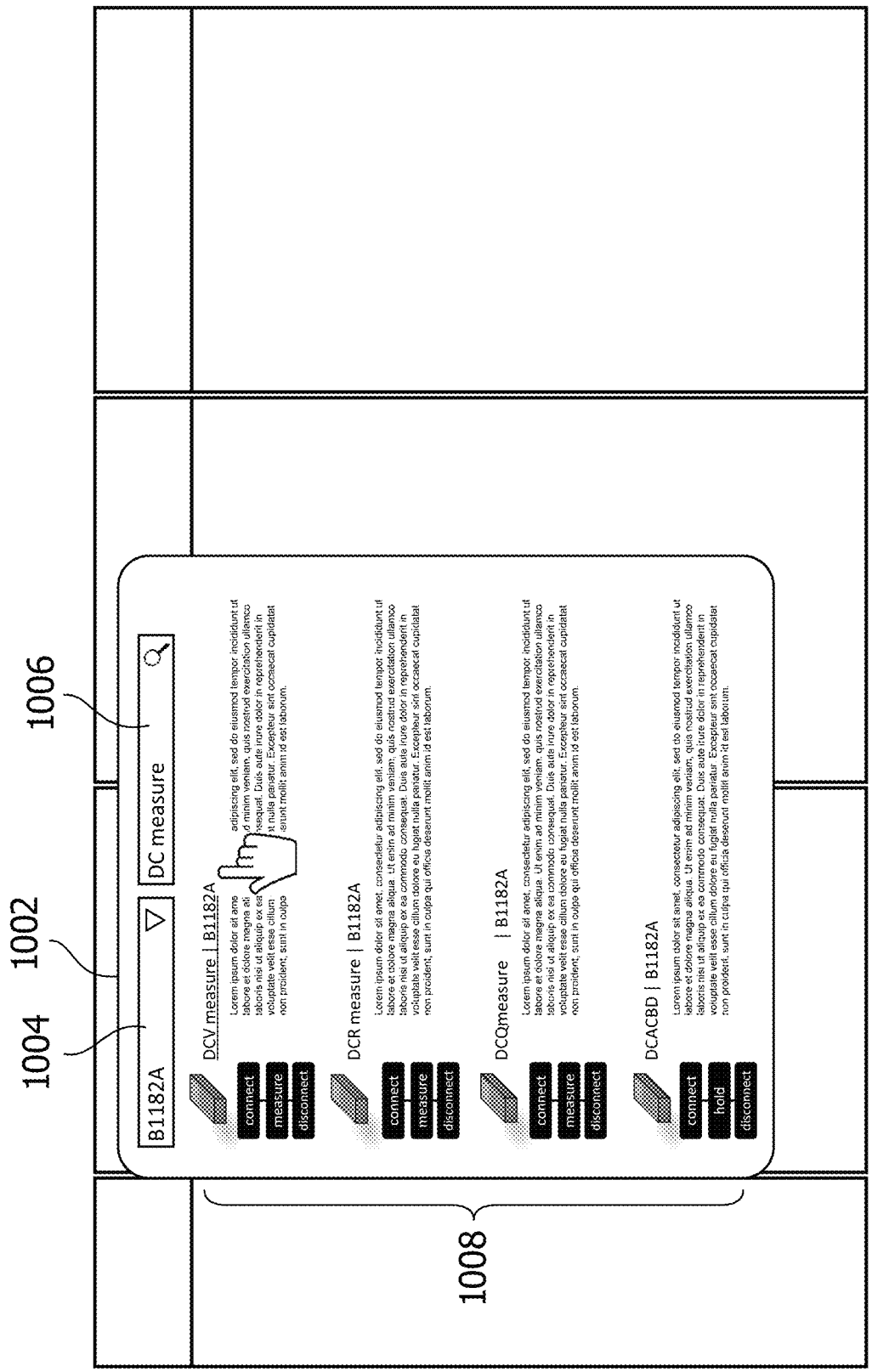

As a result, as illustrated by a window 1002 in FIG. 10, a window for searching for a function sequence that can be used for the measurement module "B1182A" selected in FIG. 9 is displayed. On this screen, so that B1182A can be easily selected from among many function sequences, for example, the user inputs "DC measure" as a search keyword into a search field 1006 by using a keyboard or other such input device, and executes the search by using the mouse, for example. As a result, function sequence candidates including the searched keyword are displayed in the window 1002, as illustrated by a reference numeral 1008. In the example of FIG. 10, the user selects "DCV measure|B1182A", which is the topmost candidate, by using the mouse, for example.

Figure 11:
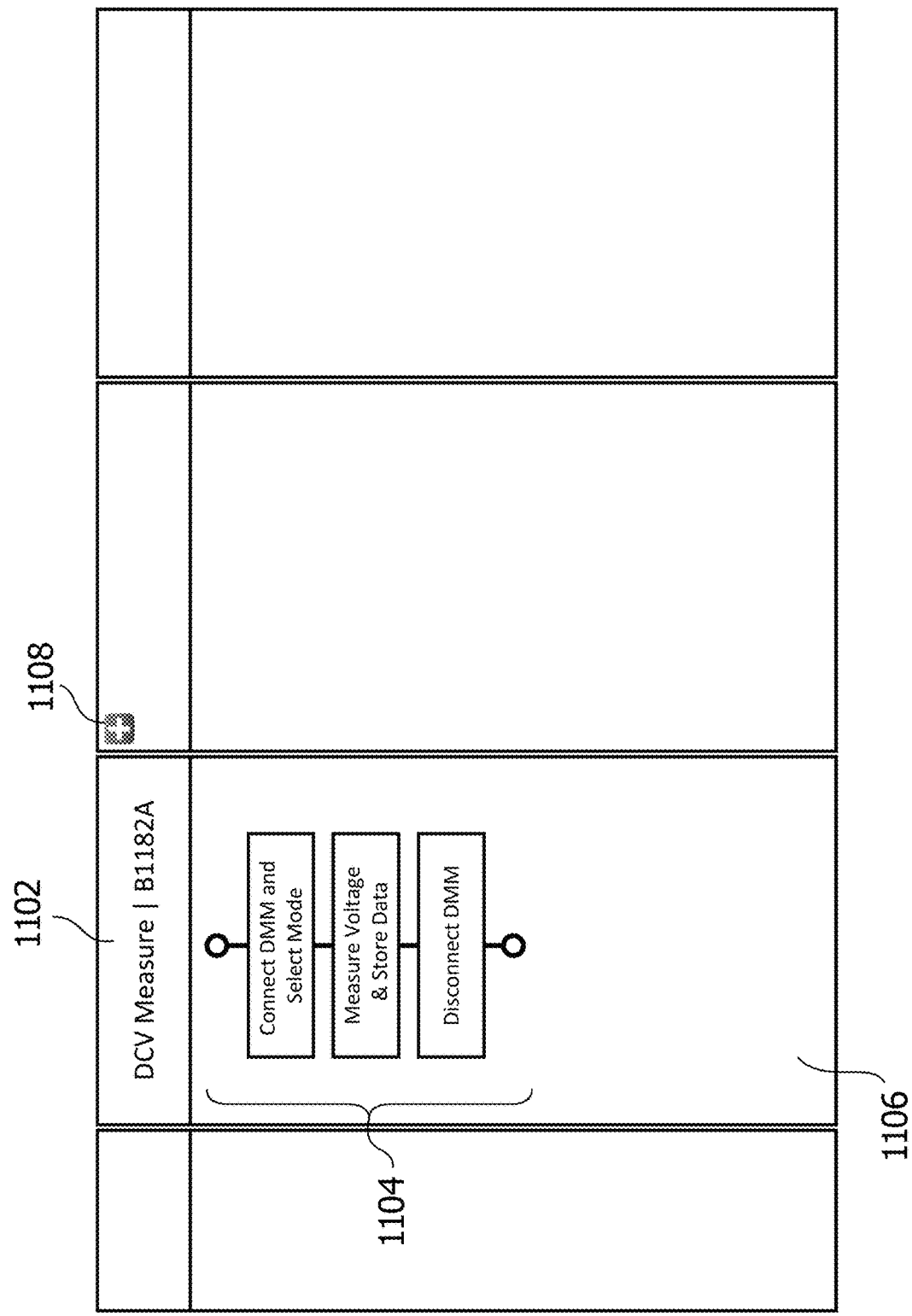

As a result, as illustrated in FIG. 11, the title of the selected function sequence is displayed in a title row 1102 of the second column from the left, and the selected function sequence 1104 is displayed in a programming area 1106 of the function column in the second column from the left. In the screen of FIG. 11, the selected function sequence 1104 has basic steps of "Connect DMM and Select Mode", "Measure Voltage and Store Data", and "Disconnect DMM". Here, DMM is an abbreviation of "Digital Multi-Meter". In addition, measured voltage data is stored to a file in a predetermined format, such as, CSV format. A plus icon 1108 for facilitating programming of the new measurement module is displayed in the title row of the third column from the left in FIG. 11.

Figure 12:
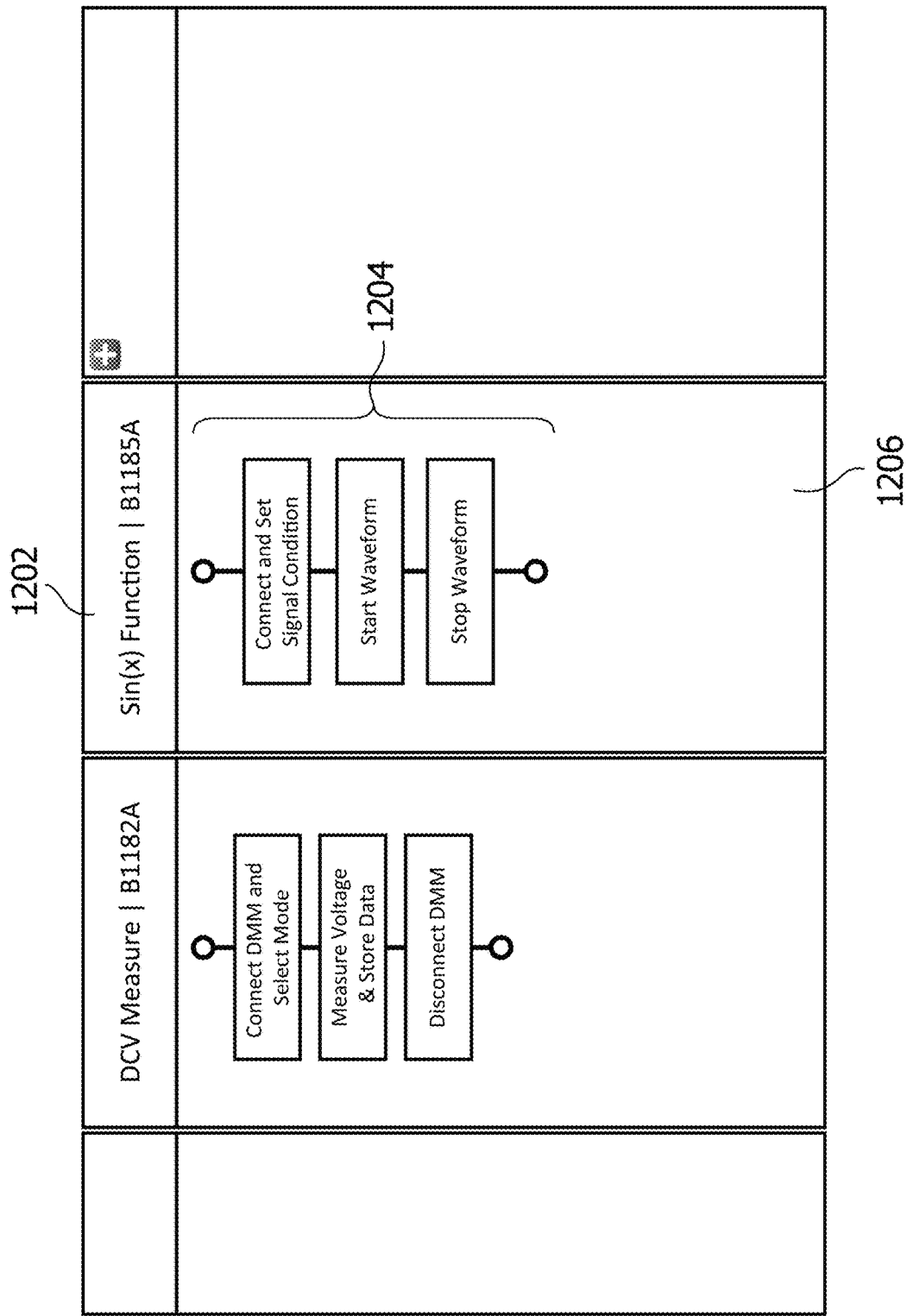

In FIG. 12, there is illustrated a state in which, as a result of continuing operation on the function column diagram in the manner described above, a function sequence 1204 of the function sequence "Sin(x) Function" of the measurement module B1185A is displayed in a programming area 1206 for the third column from the left. As the result, function sequence 1204 in FIG. 12 has basic steps of "Connect and Set Signal Condition", "Start Waveform", and "Stop Waveform".

Figure 13:
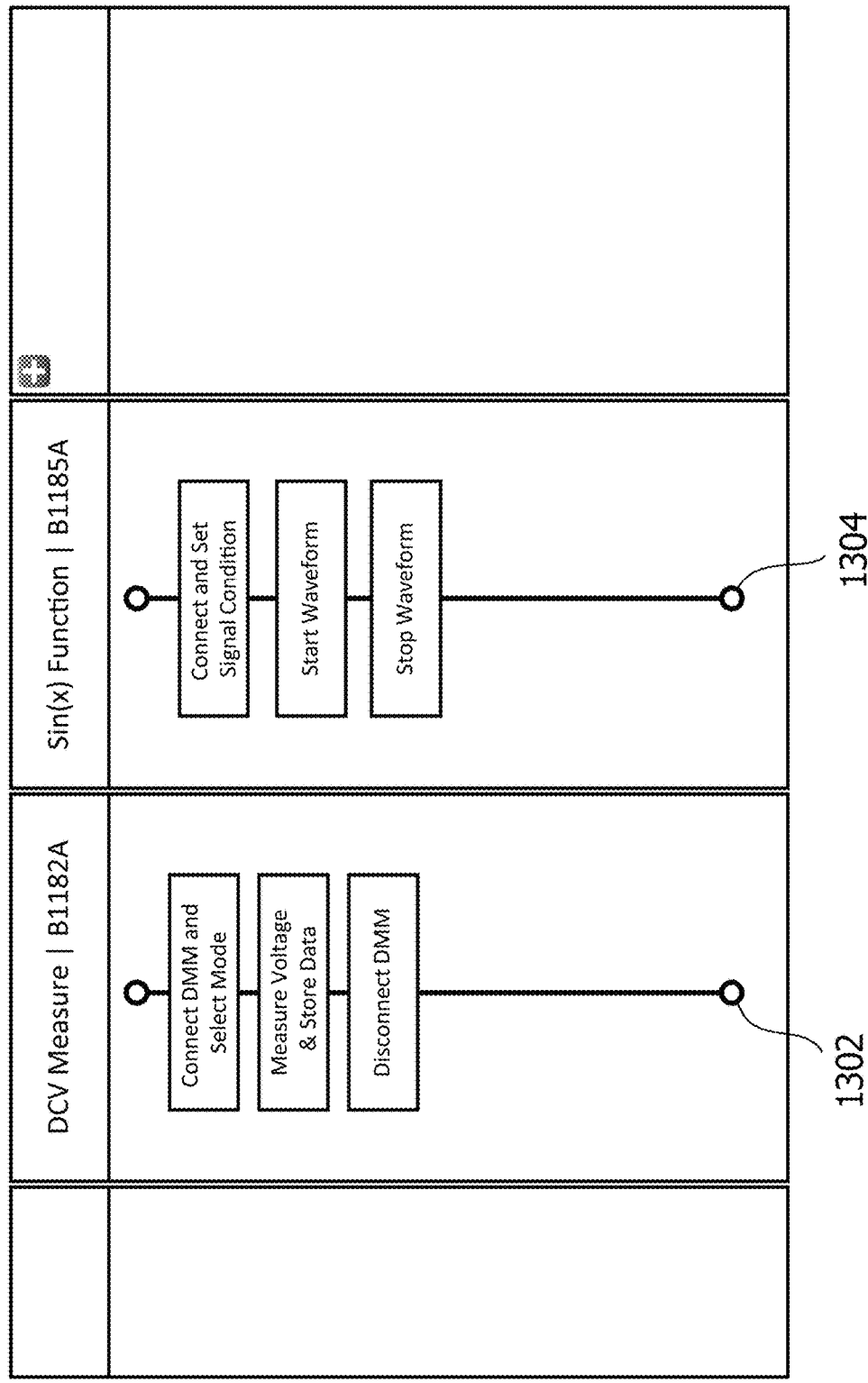

Next, in FIG. 13, there is illustrated a state in which, for the two function sequences displayed in the function column diagram, the lifelines have been lengthened by pulling down lower ends 1302 and 1304 of each of the two function sequences by a mouse operation to widen the workable area for arrangement of the basic steps.

Figure 14:
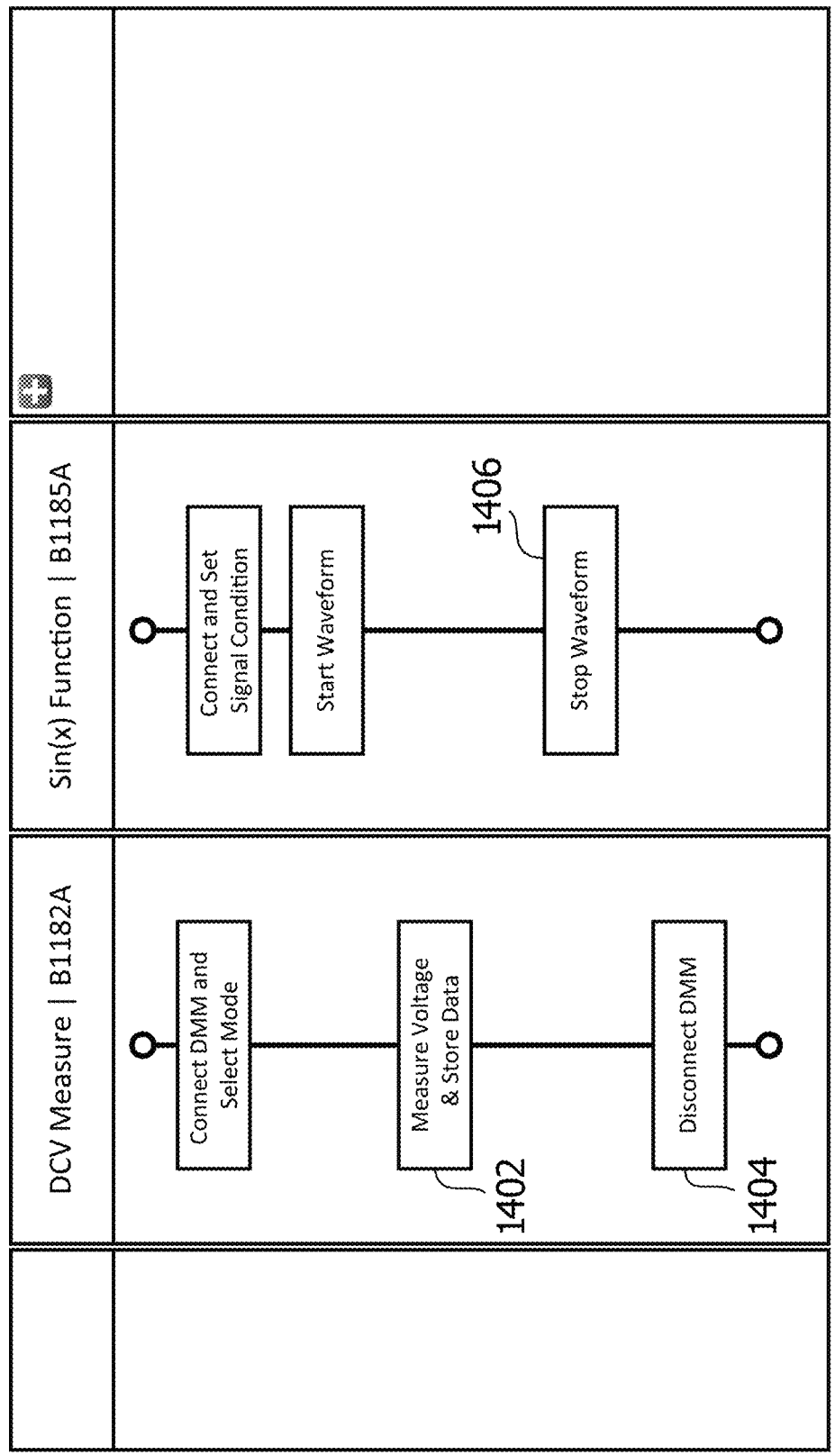

Next, in FIG. 14, there is illustrated a state in which, based on the content of each of the basic steps of the two function sequences, basic steps 1402, 1404, and 1406 have been moved by using the mouse so that the arrangement of the temporal relationship on the time axis is appropriate.

Figure 15:
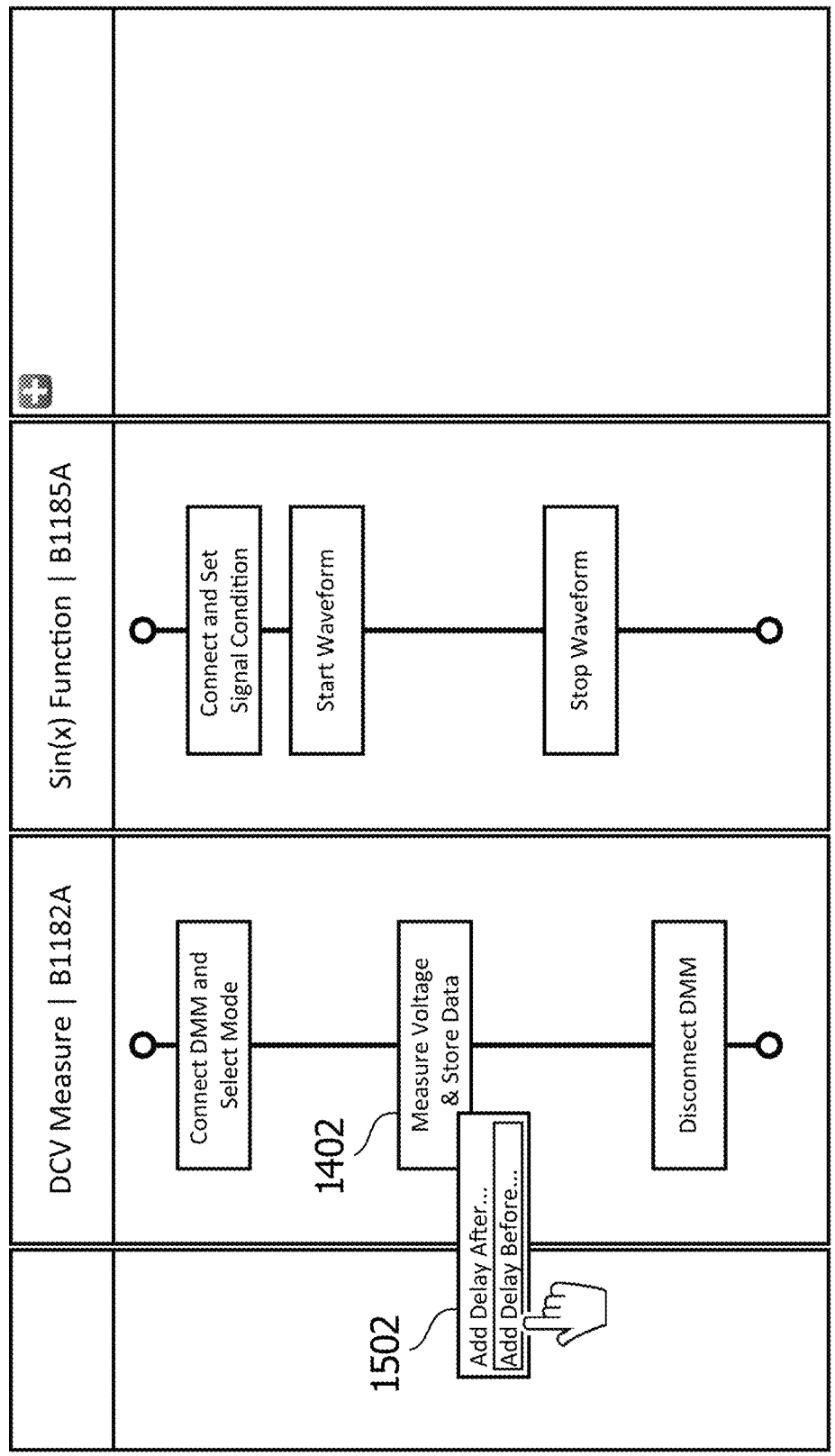

Next, in FIG. 15, there is illustrated a state in which, as an operation for adding a pre-delay to the basic step 1402 moved in FIG. 14, the mouse is left-clicked on the basic step 1402 to select "Add Delay Before . . . " of a command for designating a position of a delay to be inserted from the displayed menu 1502.

Figure 16:
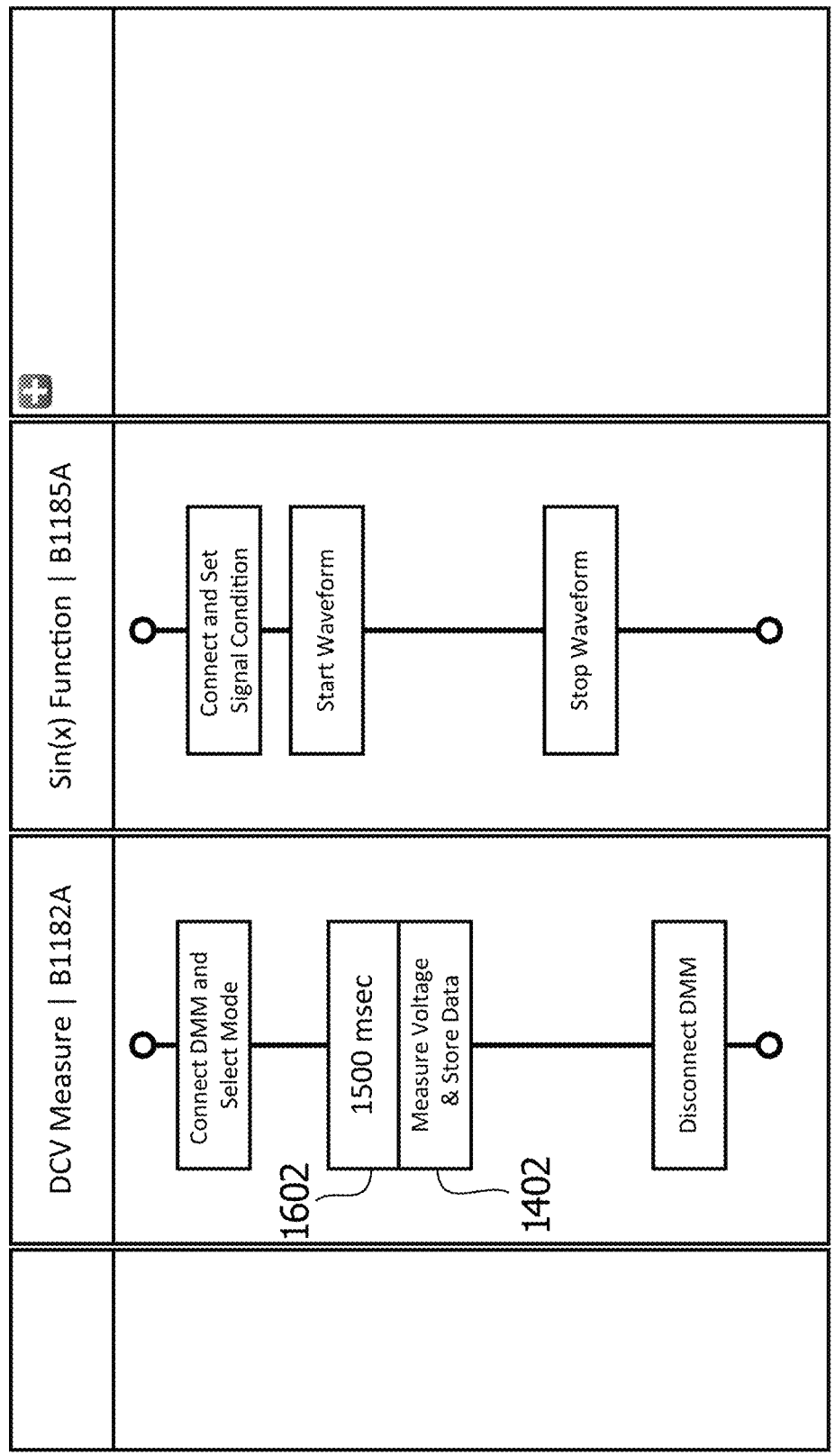

Next, in FIG. 16, there is illustrated a state in which, following the operation of FIG. 15, a delay time of "1500 msec" has been input by a setting for adding a delay of 1,500 msec, and as a pre-delay prior to the basic step 1402, a delay setting 1602 is displayed in a state in which the input delay time is displayed.

Figure 17:
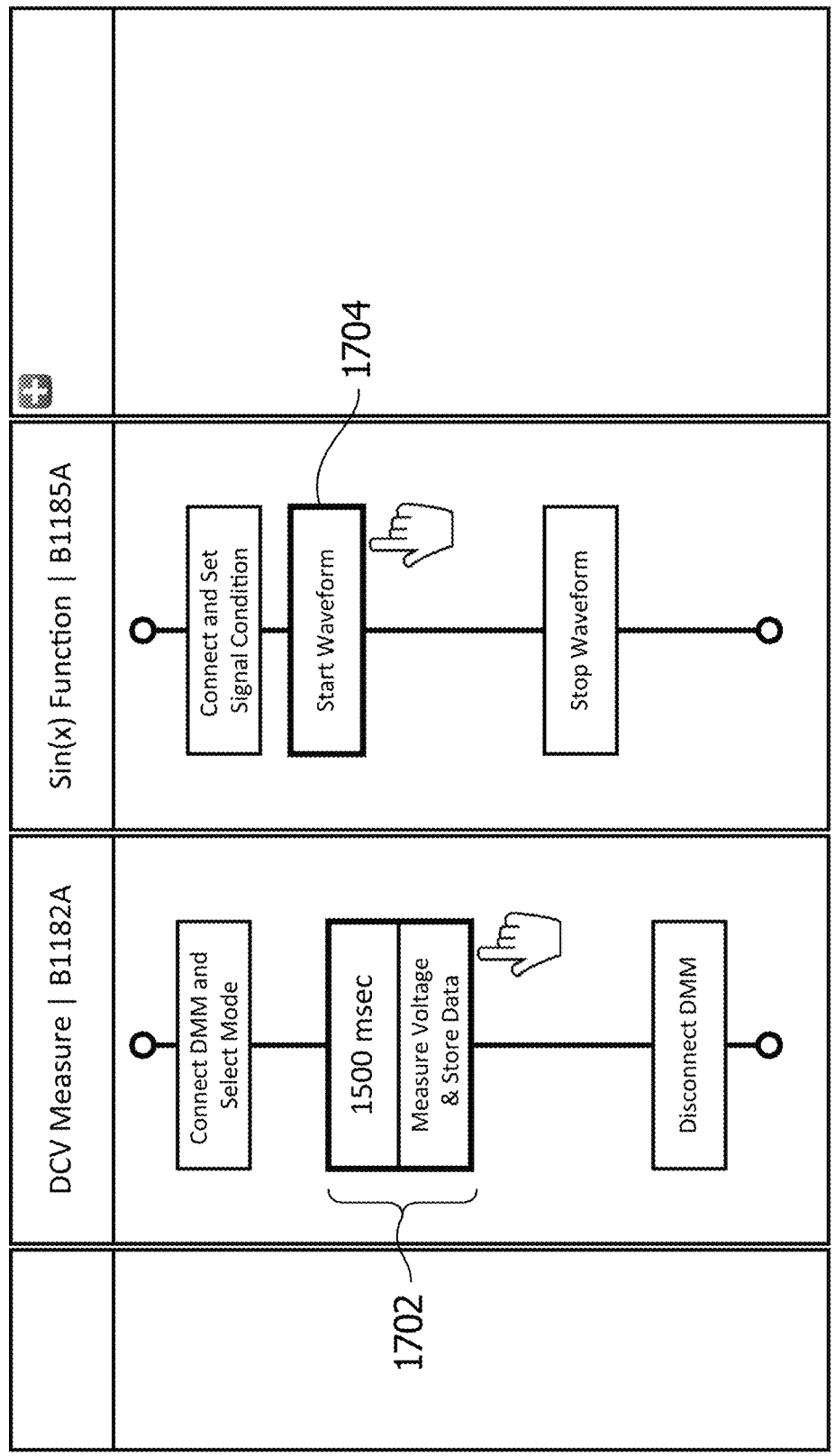

Next, in FIG. 17, there is illustrated a state in which, as a description of an operation for synchronizing a plurality of basic steps, first, basic steps 1702 and 1704 have been left-clicked in order while pressing a controller key such that the two basic steps 1702 and 1704 are both selected and displayed in a highlighted manner.

Figure 18:
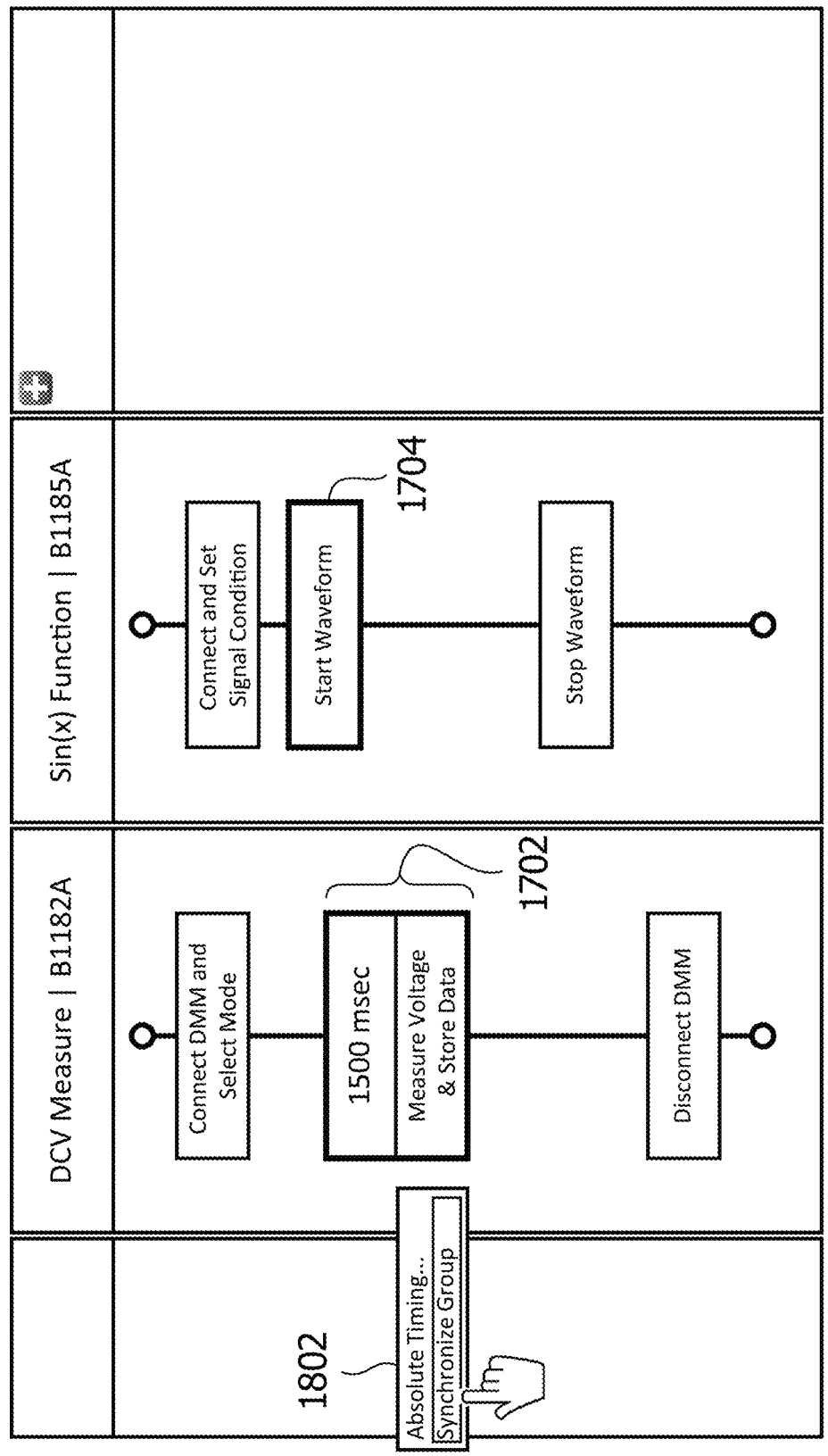

Next, in FIG. 18, there is illustrated a state in which, as a continuation of the description of the operation for synchronizing a plurality of basic steps, a command "Synchronize Group" for designating synchronization is selected from a displayed menu 1802 by, in the state of FIG. 17, right-clicking the mouse.

Figure 19:
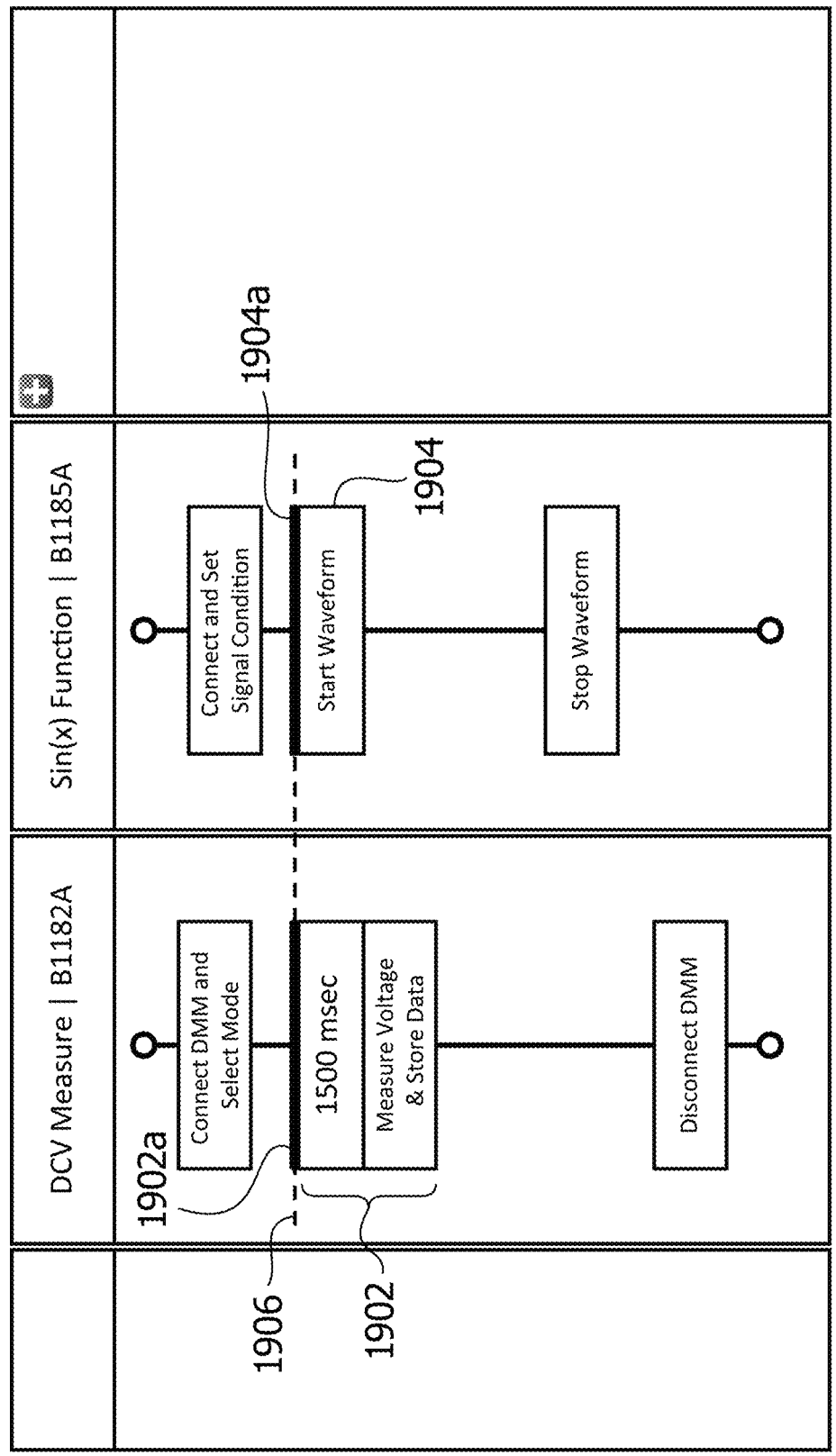

Next, in FIG. 19, there is illustrated a state in which, as a further continuation of the description of the operation for synchronizing a plurality of basic steps, as a result of the operation of FIG. 18, the vertical position of the upper side or upper edge of the blocks of each of basic steps 1902 and 1904 has been adjusted so as to be the same height, the upper side or upper edge of each of the blocks is displayed in a highlighted manner by thick lines 1902a and 1904a, and a dashed-line additional line 1906 indicating that the upper side 1902a or upper edge 1904a of each of those blocks is to be executed in synchronization is drawn across the two function columns.

Figure 20:
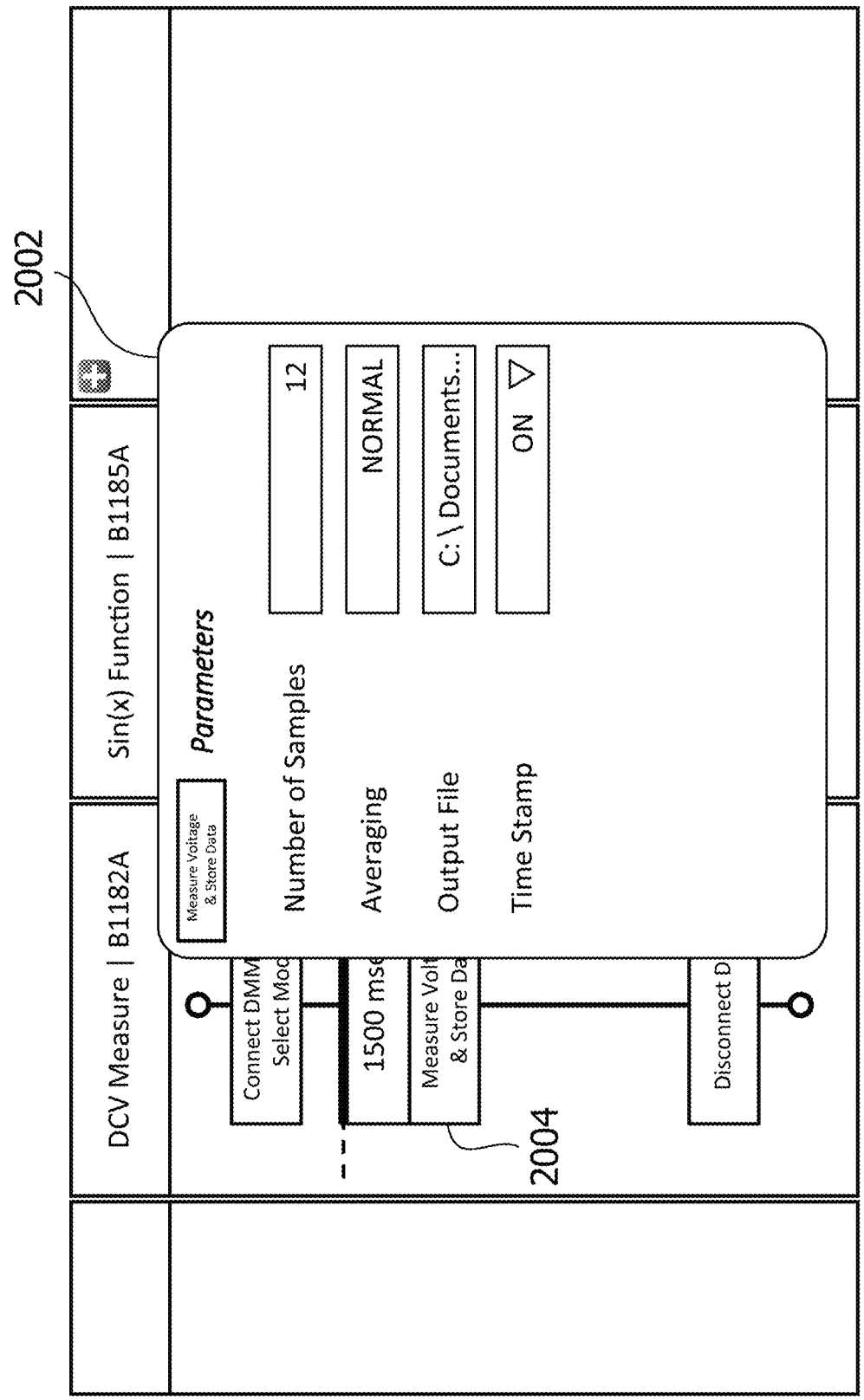

Next, in FIG. 20, there is illustrated a state in which, as a further continuation of the description of the operation for synchronizing a plurality of basic steps, after the operation of FIG. 19, as an operation for setting advanced settings of a basic step 2004, the mouse has been left-clicked on the basic step 2004, and a desired value or setting has been input in four input fields of a displayed advanced settings window 2002.

Figure 21:
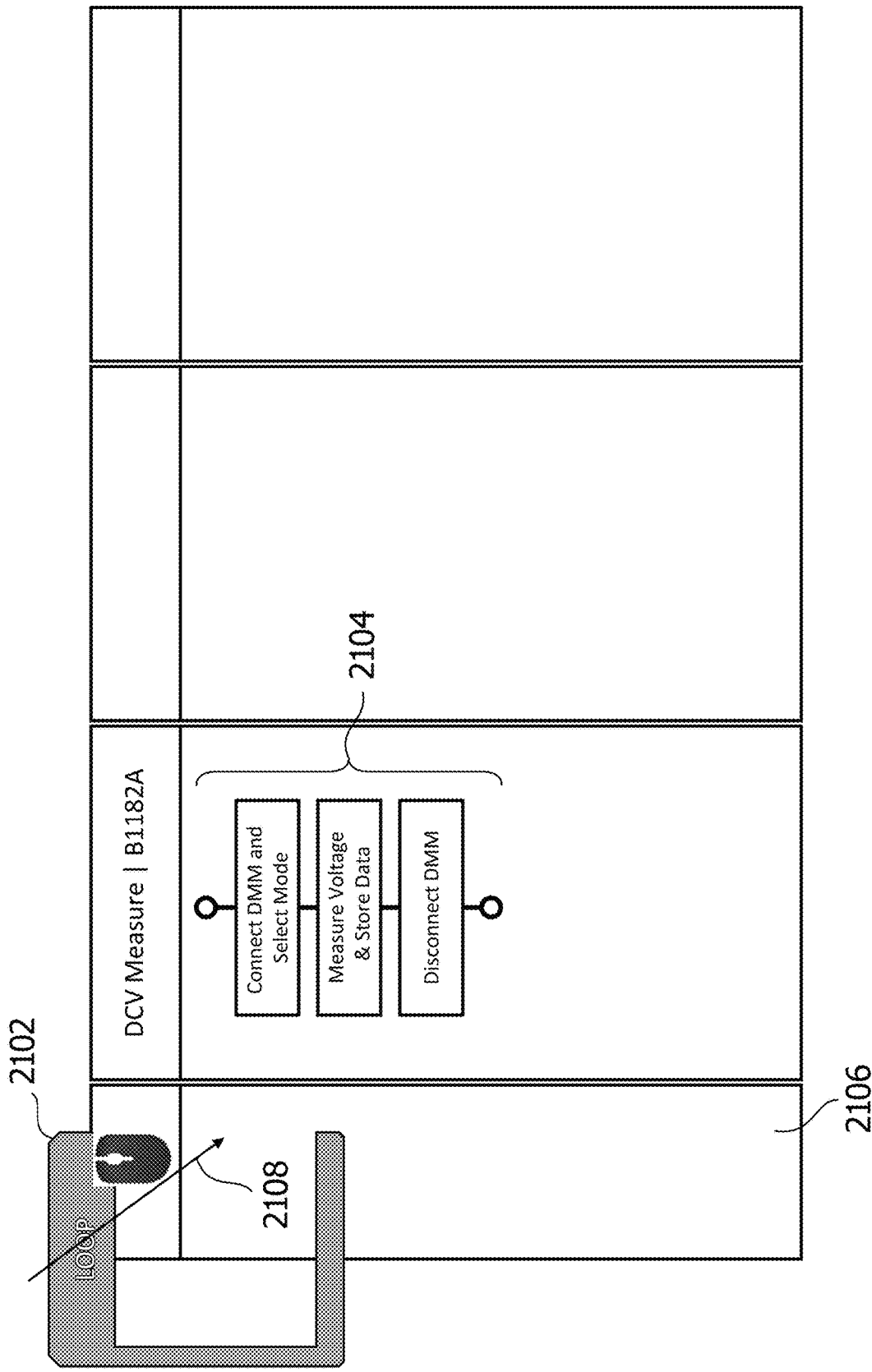

Next, in FIG. 21, there is illustrated a state in which, as an example illustrating an operation for setting a loop control structure as global control, a loop control structure symbol 2102 is moved as indicated by an arrow 2108 to a column 2106 for global control by using the mouse to select insertion of a loop control structure from, for example, a menu on a function column diagram in which the function sequence "DCV Measure" 2014 of the same measurement module B1182A as in FIG. 11 is displayed.

Figure 22:
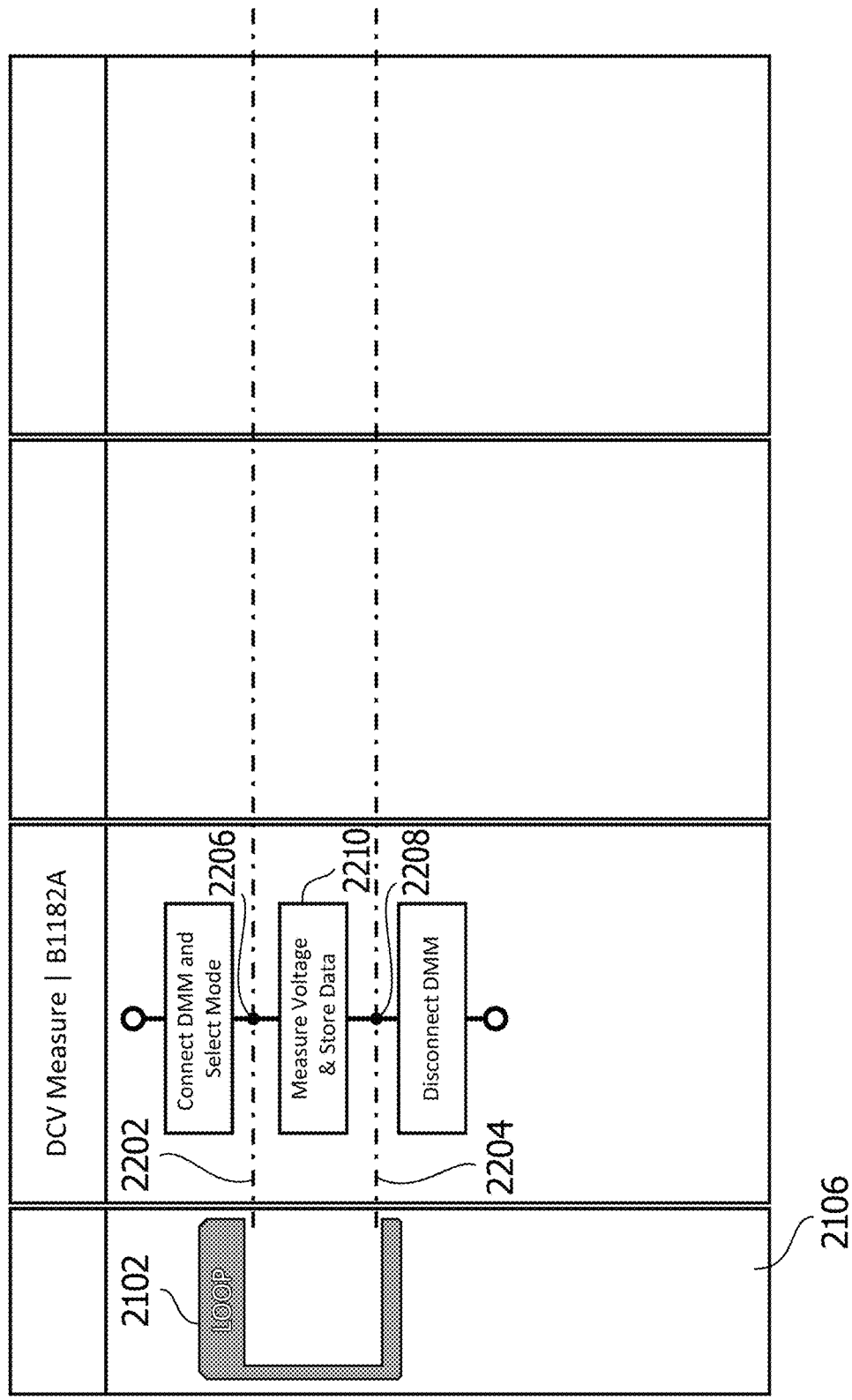

Next, in FIG. 22, there is illustrated a state in which, as a continuation of the operation for setting a loop control structure as global control, the loop control structure symbol 2102 is arranged in the column 2106 for global control so that a basic step 2210 is to be looped, and together with that operation, dashed-dotted line global wait lines 2202 and 2204 are displayed, and wait points 2206 and 2208 are displayed on the lifeline.

Figure 23:
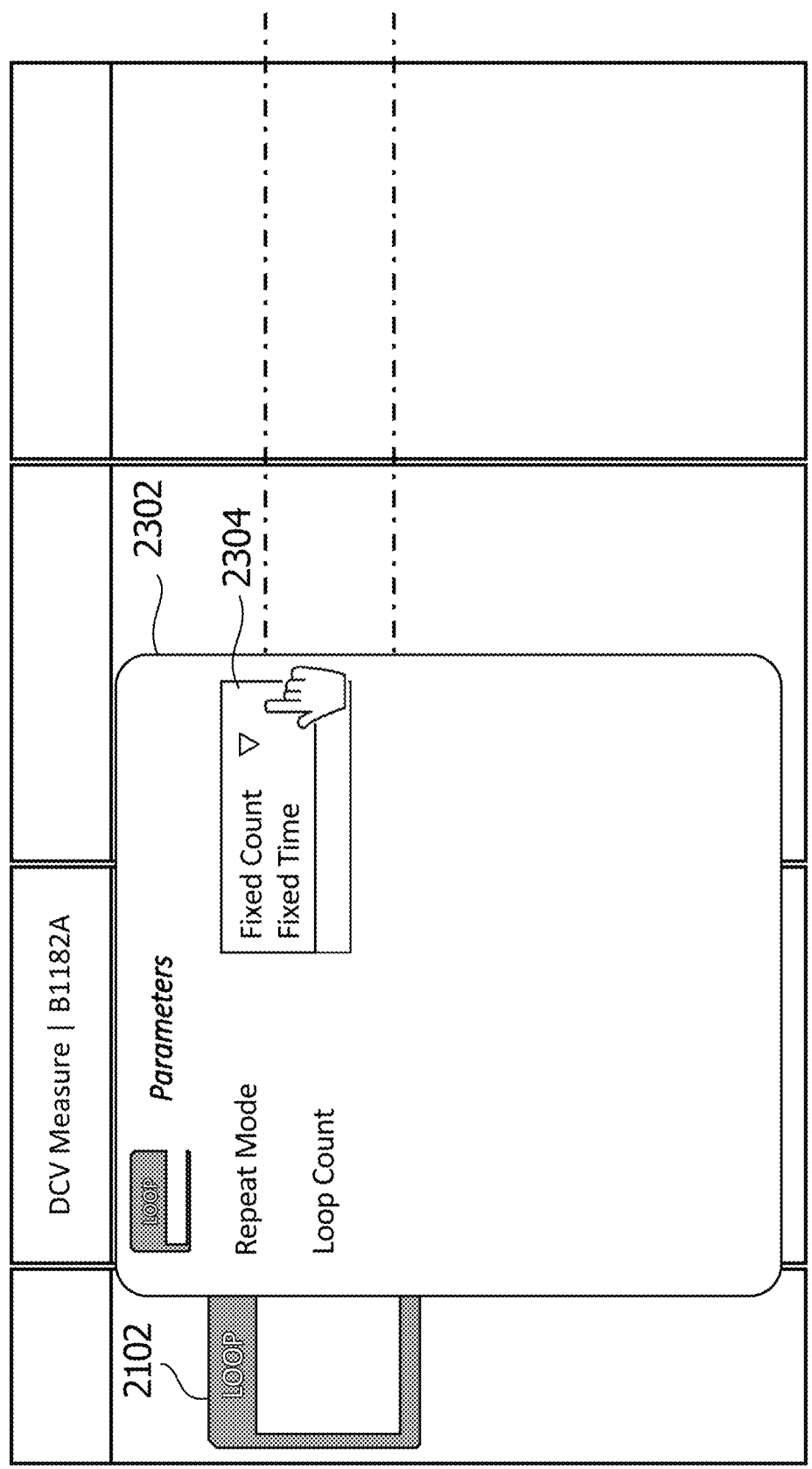

Next, in FIG. 23, there is illustrated a state in which, as a further continuation of the operation for setting a loop control structure as global control, the mouse is used to left-click the loop control structure symbol 2102 in order to display an advanced settings window 2302, and an appropriate option is selected from a "Repeat Mode" field 2304.

Figure 24:
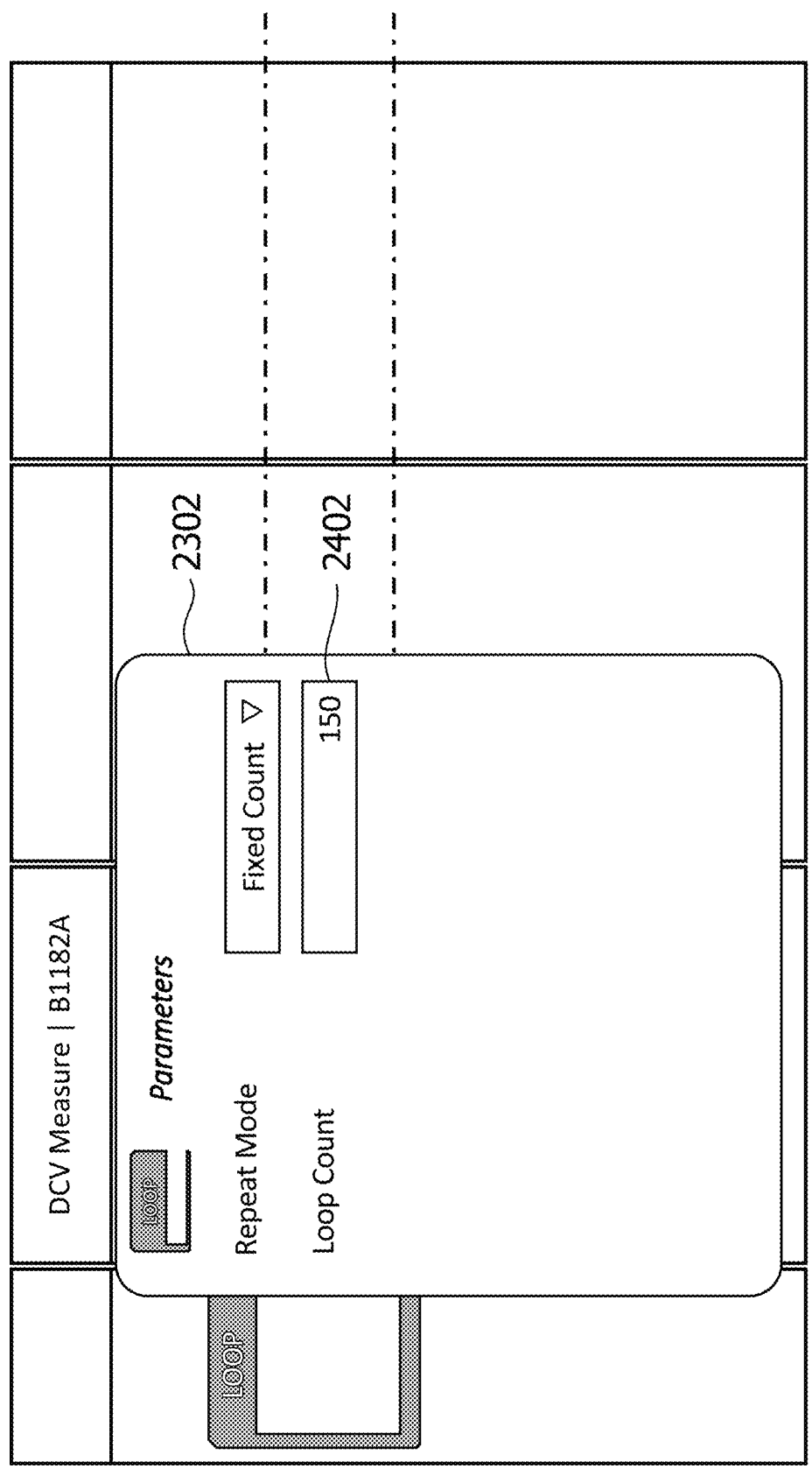

Next, in FIG. 24, there is illustrated a state in which, as a further continuation of the operation for setting a loop control structure as global control, in the advanced settings window 2302 of FIG. 23, setting of the "Repeat Mode" field is ended, and a setting value 150 has been input in a "Loop Count" field 2402. Performing a series of settings in this manner enables a loop control structure to be set as global control.

A method of designating a global control structure has been described above with reference to FIG. 21 to FIG. 24 by using a loop structure as an example. However, the above-mentioned method can be applied to the various global control structures described with reference to FIG. 4 and FIG. 5, and can also be applied to the function column diagram of FIG. 19 in which a plurality of measurement modules are described.

Block Diagram of Measurement System Having Programming Environment According to Present Invention Installed Therein In FIG. 1, there is illustrated a block diagram of a measurement system 100 in which the above-mentioned programming environment is installed. A controller 102 includes a timer (i.e., synchronized timer) 104 for synchronizing the timing of the modules in the system, a processor 106 configured to perform calculation processing, and a memory 108, which is accessible from the processor 106 and which is configured to store data and programs. The timer 104 is accessible from the processor 106. The controller 102 further includes a keyboard/pointing device 114 for an input operation and a display device 116 for display. The controller 102 may also include a printer or other such output device (not shown). The pointing device may be, for example, a mouse, a trackball, and/or a touch screen. The program of the above-mentioned function column programming environment may be executed in the processor 106 and the memory 108 of the controller 102. A function column diagram for testing may be written in the processor 106 and the memory 108 of the controller 102. The controller 102 can be configured to control one or more measurement modules 120, 130, and 140, and to test a device under test (DUT) 150 via signal lines 152, 154, and 156. Each control module 120, 130, and 140 includes, based on the control module 120 as a representative example, a timer 122 for timing synchronization, a processor 124 for performing calculation processing, a memory 126, which is accessible from the processor 124 and which is configured to store data and programs, and a function module, that is, a measurement function 128 in FIG. 1, which is controlled by the processor 124 and which is configured to perform a predetermined measurement function. The timer 122 is accessible from the processor 120. The configuration of the measurement module 120 is the same for the other measurement modules 130 and 140 as well. The timer 122 is connected to the timer 104 of the controller 102 and the timers 132 and 142 of the other measurement modules 130 and 140 by a timing synchronization path (in FIG. 1, indicated as "Timing Sync Path") or a synchronized control line 110. The timer 122 is configured to synchronize the timing of the measurement module 120 with the controller and the other measurement modules. The processor 124 is connected to the processor 106 of the controller 102 and the processors 134 and 144 of the other measurement modules 130 and 140 by a data path (in FIG. 1, indicated as "Data Path") or a data line 112. The processor 106 is configured to transmit and receive various types of data to and from the processors 106, 134, and 144.

The processor 106 and the memory 108 of the controller 102 can be configured to copy, when a measurement sequence is to be executed, before measurement starts, program data, setting data, and other such data regarding an execution portion relating to global control (e.g., loops, branches, etc.) to an area for executing the measurement sequence in the memory, and to execute the measurement sequence.

Program data, setting data, and other such data relating to execution of the measurement sequence for each measurement module is downloaded from the controller 102 to the memory of each measurement module prior to start of measurement, and the measurement sequence is executed by the processors 124, 134, and 144 of respective measurement modules at the time of start of measurement.

The controller 102 may be a controller in which a timer for synchronized control has been installed in a computer like an external personal computer (PC) in which an operating system (OS) such as Windows (trademark) or Linux (trademark) is installed. The controller 102 may also be a controller installed in a measurement instrument as a computer including a processor and a memory capable of executing a program of an overall environment, for example, of a graphical user interface (GUI), as well as a program for controlling the measurement instrument in an integrated manner. The controller 102 may also be a controller in which a timer for synchronized control is installed.

The measurement functions 128, 138, and 148 of the measurement modules 120, 130, and 140 may include a measurement function unit for a single channel. The measurement functions 128, 138, and 148 may also include a measurement function unit for a plurality of channels, or a plurality of measurement function units in a combined manner.

The processor, the memory, and the timer of each of the measurement modules 120, 130, and 140 include, in addition to the above-mentioned function for synchronizing the timing of the measurement function, a function capable of executing and controlling a downloaded measurement sequence.

The measurement modules 120, 130, and 140 may be installed in the same housing as that of the controller 102. The measurement modules 120, 130, and 140 may also be housed in the housing of a separate measurement instrument different from the controller 102. The measurement modules 120 and 130 may also be housed in a different measurement instrument from the measurement module 140, for example. In such a case, the measurement instrument in which the measurement module 140 is housed may be a measurement instrument including a separate controller.

The timing synchronization path 110 and the data path 112 may each be a bus including a dedicated control line, or may each be implemented by using a network line of a local area network (LAN) or a wide area network (WAN), for example. When a network line is used for the timing synchronization path 110 and the data path 112, the measurement modules 120, 130, and 140 may be installed at a remote location from the controller 102, and a standard like Institute of Electrical and Electronics Engineers (IEEE) 1588 Precision Time Protocol, for example, can be used for the timing synchronization path 110.

During execution of the program, the processor 106 of the controller 102 and the processors 124, 134, and 144 of all the measurement modules start to execute the program simultaneously in synchronization with a start trigger issued by the timer 104 of the controller 102. Specifically, each of the processors 124, 134, and 144 is configured to execute, when the execution start time of each step is reached by each of the timers 122, 132, and 142, an operation allocated in advance. When a measurement value of the measurement module 130, for example, is required for a conditional branch of the controller 102, that measurement value is transferred to the processor 106 of the controller 102 from the processor 134 of the measurement module 130 via the data path 112 when the measurement value becomes available. The time taken to execute each step and the time taken to complete the transfer of the data, for example, place a restriction on the timing of the next step to be executed by each processor, and thus, care needs to be given to design a maximum delay time capable of reliable completion within that time. In the programming environment according to the present invention, the user is guided so that programming is performed by abiding to that maximum delay time.

Based on the configuration described above, the synchronized operation, the synchronized operation with various delay designations, the basic step waiting operation, and the basic step start time designation illustrated in FIG. 2D to FIG. 2G can be executed by using several or all of the timer 104 of the controller 102 and the timers 122, 132, and 142 of each of the measurement modules.

Based on the configuration described above, a unit combining the timer 104, the processor 106, and the memory 108 of the controller 102 plays the role of a so-called master sequencer, and a unit combining the timer, the processor, and the memory of each of the measurement modules 120, 130, and 140 plays the role of a so-called slave sequencer. As a result, even though the timing precision may not be as good as Related Art Documents 2 to 4, in terms of timing precision, a system configured to execute measurements that are managed more correctly in relation to timing synchronization than a system combining background-art measurement instruments can be provided.

In FIG. 1, as an example, there are illustrated three measurement modules, but the number of measurement modules may be different. The measurement system 100 can be constructed from a freely chosen number of one or more measurement modules, and it is to be understood that, in the above-mentioned programming environment, even such a case may be easily handled by horizontally adding columns corresponding to the measurement modules to the function column diagram.

The programming environment described above may also be constructed on a computer like a single PC. From the perspective of that single PC, a measurement module is created as a program in a programming environment that is in an offline state. After the program has been created, the program may be executed from a measurement system by connecting the single PC to a measurement system like that illustrated in FIG. 1 by a LAN, a WAN, or other such network.

After the program is created in an offline programming environment on the single PC, the program may also be executed by connecting the single PC to each measurement module by a network so that the single PC is online. This fact can be understood from the description above relating to FIG. 1.

Regarding the arrangement on the screen of the function column diagram, the point that the basic steps of the function columns are arranged from top to bottom in accordance with the elapse of time may be reversed, that is, the basic steps of the function columns may be arranged from bottom to top in accordance with the elapse of time. Regarding the point that the column for global control is arranged as the column farthest to the left of the screen, and the function column relating to the plurality of measurement modules is arranged to the right side of that column, the left/right arrangement of those columns may be reversed, or the column for global control may be arranged as a column more toward the middle.

As other screen arrangements of the function column diagram, the screen of the diagram may be rotated 90 degrees counterclockwise, a plurality of function columns may be implemented as a plurality of function rows, the basic steps may be arranged from left to right in accordance with the elapse of time in the screen lateral direction, and synchronization may be displayed by a vertical line. As the column for global control, the row for global control in such a case may be arranged in the uppermost column, or the elapse of time may be displayed in reverse.

Advantages of the present invention are as follows.

One of advantages of the present invention is that it is possible to promote for reuse and distribution of basic measurement sequences in programming.

Thereby, according to the present invention, it is possible to define control of the basic measurement sequences of connecting signal path between a device and measurement modules and/or setting condition, application and/or measurement of a signal, and disconnecting signal path between a device and measurement modules are defined on each measurement module. There are comparatively few variations of the basic measurement sequence. In the measurement system according to the present invention, the basic measurement sequence can be reused as it is by many applications. The only work performed by the user as programming is to select the basic measurement sequences, set the parameters for those measurement sequences, and adjust the timing of each step. Therefore, the user does not need to bear in mind numerous things in order to program the measurement instruments, and not much time is needed to create the measurement program.

Another advantage of the present invention is that it is possible to simplify the control on real-time axis.

That is, in the procedural control of Related Art Documents 1 to 4, the control steps of a plurality of measurement modules are written as a mixed sequence, and hence there are difficulties in identifying the measurement function that each individual step corresponds to. However, when the programming environment according to the present invention is used, a vertically long measurement sequence of each measurement module can be managed as a diagram arranged horizontally, which enables the temporal relationship and the measurement functions to be organized, and facilitates identification of the temporal relationship and the measurement functions of the steps. The temporal relationship of steps that are adjacent to each other can be changed just by vertically moving the symbol representing a step on the screen. The execution time of the measurement steps from the sequence start can also be designated. Synchronized operation, for example, executing the steps simultaneously or at a fixed time difference by a plurality of measurement functions, is also possible. Such synchronized operations were very difficult to write with the procedural control of Related Art Documents 1 to 4 (e.g., hitherto, it was required to set an external trigger function and set up a trigger source). However, the benefits of creating and using various types of loops and conditional branches, and advanced measurement steps based on abstraction, which is a strong point of procedural control, can continue to be used also in the programming environment according to the present invention.

Yet another advantage of the present invention is that it is possible to provide a software defined measurement instrument according to the embodiment.

Based on the programming environment according to the present invention, it is thought that the way in which the programming interface of measurement modules, that is, measurement instruments, is provided will change. As a result, the user will be able to obtain the functions the user wants to use more easily, and an environment that can easily provide high-functionality and/or high-performance measurement functions specific to an application can be provided. It is also thought that when an environment is provided that promotes the reuse and distribution of basic measurement sequences, which as a result provides an environment in which the user can easily create a wide variety of measurement applications, the measurement instrument functions themselves will also change. For background-art measurement instruments, functions directly reflecting the function of the internal configuration or subsystems of the measurement instrument, for example, voltage, frequency, and bandwidth, are shown to the programmer. In contrast, when the present invention is applied, the most popular units of a function can be set as "basic measurement sequences". Many users of measurement systems will use measurement instruments in accordance with those basic measurement sequences, and thus, measurement instruments will in the future be characterized by what functions are provided as "basic measurement sequences". More specifically, this demonstrates a movement away from defining measurement instruments based on a hardware internal configuration, toward defining measurement instruments based on target-oriented "software". Therefore, it is not necessary for the user to understand the internal configuration of the measurement instruments any more than is required. For a software-defined measurement instrument, it is easy to add and handle special applications by newly developing and providing a basic measurement sequence. Even for a complex measurement instrument capable of handling a new application based on reconfigurable hardware, for example, an FPGA, it is possible to understand and use such a complex measurement instrument easily as long as a high-level function is provided by software.

An embodiment of the present invention is described above. However, the matters described above are for illustrative purposes only. One skilled in the art would be able to perform various changes, substitutions, and modifications by using the background art. Such changes are also to be included in the scope of claims of the present invention.

What is claimed is:

1. A method of creating a program for controlling, when the program is executed on a measurement system comprising a first measurement module, a second measurement module, and a controller, the first measurement module and the second measurement module, the method comprising:
    arranging a first function column for writing a function sequence of the first measurement module;

selecting a first function sequence to be used by the first measurement module from a function sequence library;

displaying the selected first function sequence in the first function column;

arranging, adjacent to the first function column in a first adjacent direction of the first function column, a second function column for writing a function sequence of the second measurement module;

selecting a second function sequence to be used by the second measurement module from the function sequence library; and displaying the selected second function sequence in the second function column, and wherein:

the first function sequence comprising one or more first execution steps to be executed in relation to the first measurement module, and the second function sequence comprising one or more second execution steps to be executed in relation to the second measurement module.

2. A method according to claim 1, wherein one of the one or more first execution steps and the one or more second execution steps comprises one of a macro execution step and a sub-routine execution step.

3. A method according to claim 1, wherein the one or more first execution steps are represented in the first function column by a block having one of a roughly rectangular shape and an oval shape, and the one or more second execution steps are represented in the second function column by a block having one of a roughly rectangular shape and an oval shape.

4. A method according to claim 3, wherein one or more first blocks having one of a roughly rectangular shape and an oval shape representing the one or more first execution steps and one or more second blocks having one of a roughly rectangular shape and an oval shape representing the one or more second execution steps are each arranged from one of a top and a bottom of the first function column and the second function column toward another of the top and the bottom of the first function column and the second function in accordance with an elapse of time.

5. A method according to claim 4, wherein the first function sequence comprises a first upper end symbol representing a start of the first function sequence, and a first lower end symbol representing a finish of the first function sequence, wherein the second function sequence comprises a second upper end symbol representing a start of the second function sequence, and a second lower end symbol representing a finish of the second function sequence, wherein the one or more first blocks having one of a roughly rectangular shape and an oval shape are arranged superimposed on a first lifeline linking the first upper end symbol and the first lower end symbol of the first function sequence, and wherein the one or more second blocks having one of a roughly rectangular shape and an oval shape are arranged superimposed on a second lifeline linking the second upper end symbol and the second lower end symbol of the second function sequence.

6. A method according to claim 1, wherein the one or more first execution steps comprise a third execution step, wherein the one or more second execution steps comprise a fourth execution step, wherein the third execution step and the fourth execution step are arranged at a roughly equal height, and wherein the third execution step and the fourth execution step are connected by a first additional line, the method further comprising designating that execution of the third execution step and the fourth execution step is to start in synchronization in the measurement system.

7. A method according to claim 6, further comprising:

arranging a first delay designation step between the first additional line and the fourth execution step; and designating that execution of the third execution step and the first delay designation step is to start in synchronization in the measurement system.

8. A method according to claim 3, wherein the one or more first execution steps comprise a fifth execution step, and the method further comprising designating, by arranging a left side of a second block having one of a roughly rectangular shape and an oval shape representing a second delay designation step to abut a right side of a first block having one of a roughly rectangular shape and an oval shape representing the fifth execution step, waiting until execution of a slower step among the fifth execution step and the second delay designation step has ended.

9. A method according to claim 3, wherein the one or more first execution steps comprise a sixth execution step, the method further comprising:

displaying, from an upper side of a block having one of a roughly rectangular shape and an oval shape representing the sixth execution step, a second additional line that is parallel across a column for global control adjacent in a second adjacent direction that is opposite to the first adjacent direction of the first function column; and designating, by designating a first elapsed time to be displayed near an end portion of the second additional line in the column for global control, an elapsed time from start of the program until start of the sixth execution step.

10. A method according to claim 1, further comprising:

arranging, in the first function column, a first control symbol for representing one of a loop of global control and a conditional branch of global control in a column for global control adjacent in a second adjacent direction that is opposite to the first adjacent direction of the first function column, the first control symbol comprising at least a first tip and a second tip having different heights, the first control symbol being arranged so that a height of the one or more first execution steps is included in a range defined between the height of the first tip and the height of the second tip; and designating the one or more first execution steps in association with an operation of the first control symbol for global control.

11. A method according to claim 10, wherein the first control symbol is for displaying at least a second additional line and a third additional line extending parallel to each other from at least the first tip and the second tip across the first function column and the second function column to clarify an execution step associated with the operation of the first control symbol.

12. A method according to claim 11, further comprising:

arranging, in the column for global control, a second control symbol for representing one of a loop and a conditional branch, the second control symbol comprising at least a third tip and a fourth tip having different heights from each other, the second control symbol being arranged so that the first control symbol is included between the third tip and the fourth tip; and designating the first control symbol in association with an operation of the second control symbol.

13. A method according to claim 1, further comprising:

arranging, in the first function column, a third control symbol for representing one of a loop and a conditional branch, the third control symbol comprising at least a fifth tip and a sixth tip having different heights from each other, the third control symbol being arranged so that the one or more first execution steps are included between the fifth tip and the sixth tip; and designating the one or more first execution steps in association with an operation of the third control symbol.

14. A method according to claim 13, further comprising:

arranging, in the first function column, a fourth control symbol for representing one of a loop and a conditional branch, the fourth control symbol comprising at least a seventh tip and an eighth tip having different heights from each other, the fourth control symbol being arranged so that the third control symbol is included between the seventh tip and the eighth tip; and designating the third control symbol in association with an operation of the fourth control symbol.

15. A measurement system comprising:

a first measurement module;

a second measurement module; and a controller configured to control the first measurement module and the second measurement module, and wherein:

the controller comprising:
  a first processor;
  a first memory accessible from the first processor; and
  a first timer accessible from the first processor, the first measurement module comprising:
  a second processor;
  a second memory accessible from the second processor; and
  a second timer accessible from the second processor, the second measurement module comprising:
  a third processor;
  a third memory accessible from the third processor; and
  a third timer accessible from the third processor, the first processor, the second processor, and the third processor being connected to each other by a data line, the first timer, the second timer, and the third timer being connected to each other by a synchronized control line, and the controller comprising:
  a first function column including one or more execution steps of a first function sequence to be executed by the first measurement module; and
  a second function column including one or more execution steps of a second function sequence to be executed by the second measurement module, the second function column being adjacent in a first adjacent direction of the first function column.

16. A measurement system according to claim 15, wherein execution of a first execution step of the first function sequence and a second execution step of the second function sequence is designated by arranging the first execution step and the second execution step at a roughly equal height in the first function column and the second function column, and connecting the first execution step and the second execution step to each other by a first additional line for representing synchronized execution, and wherein the first processor is configured to cause:
  the first timer to control the second timer and the third timer; and
  the second processor to execute the first execution step and the third processor to execute the second execution step in synchronization.

17. A non-transitory computer-readable program recording medium having stored therein an instruction to execute the method of claim 1 when being executed on the controller.

18. A non-transitory computer-readable program recording medium having stored therein an instruction to execute the method of claim 6 when being executed on the controller.

19. A non-transitory computer-readable program recording medium having stored therein an instruction to execute the method of claim 7 when being executed on the controller.

20. A non-transitory computer-readable program recording medium having stored therein an instruction to execute the method of claim 9 when being executed on the controller.

* * * * *